United States Patent
Shimoda et al.

(10) Patent No.: US 6,297,652 B1
(45) Date of Patent: Oct. 2, 2001

(54) ELECTRIC RESISTANCE MEASURING APPARATUS AND METHOD FOR CIRCUIT BOARD

(75) Inventors: Sugiro Shimoda, Hidaka; Kiyoshi Kimura, Hanno, both of (JP)

(73) Assignee: JSR Corporation, Tokyo (JP)

( * ) Notice: Subject to any disclaimer, the term of this patent is extended or adjusted under 35 U.S.C. 154(b) by 0 days.

(21) Appl. No.: 09/510,673

(22) Filed: Feb. 22, 2000

(30) Foreign Application Priority Data

Feb. 24, 1999 (JP) .................................... 99-47012

(51) Int. Cl.[7] .................. G01R 27/02; G01R 31/02; G01R 27/08; G01R 31/26

(52) U.S. Cl. .................. 324/754; 324/761; 324/691; 324/158.1; 324/713; 324/715; 324/765

(58) Field of Search .................. 324/754, 691, 324/722, 421, 538, 158, 761, 72.5, 757, 713, 715, 537, 765

(56) References Cited

U.S. PATENT DOCUMENTS

| | | | |
|---|---|---|---|
| 3,996,514 | 12/1976 | Brown et al. | 324/722 |
| 4,321,533 | * 3/1982 | Matrone | 324/757 |
| 4,471,298 | * 9/1984 | Frohlich | 324/72.5 |
| 4,496,903 | * 1/1985 | Paulinski | 324/761 |
| 4,626,776 | * 12/1986 | Wilkinson | 324/761 |
| 4,626,779 | * 12/1986 | Boyle | 324/754 |
| 4,707,657 | * 11/1987 | Boegh-Peterson | 324/537 |
| 4,771,236 | * 9/1988 | Banks | 324/158.1 |
| 4,833,402 | * 5/1989 | Boegh-Patersen | 324/754 |
| 4,952,871 | 8/1990 | Driller et al. | 324/754 |
| 5,162,729 | * 11/1992 | Lusby | 324/766 |
| 5,491,424 | * 2/1996 | Asar et al. | 324/715 |
| 6,118,286 | * 9/2000 | Fredrickson | 324/754 |

FOREIGN PATENT DOCUMENTS

| | | | |
|---|---|---|---|
| 09026446-A | * 7/1995 | (JP) | G01R/27/02 |
| WO 89/00296 | 1/1989 | (WO) . | |
| WO 98/13695 | 4/1998 | (WO) . | |

OTHER PUBLICATIONS

Patent Abstracts of Japan, JP 09–026446, Jan. 28, 1997.
Patent Abstracts of Japan, vol. 8, No. 183 (P–296), Aug. 23, 1984, JP 59–075162, Apr. 27, 1984.

* cited by examiner

Primary Examiner—Glenn W. Brown
Assistant Examiner—Wasseem H. Hamdan
(74) Attorney, Agent, or Firm—Oblon, Spivak, McClelland, Maier & Neustadt, P.C.

(57) ABSTRACT

Provided are an electric resistance measuring apparatus for circuit boards, and an electric resistance measuring method using the same.

An electric resistance measuring apparatus includes a one-side inspection circuit board having a plurality of connecting electrodes, and layer connector members provided on the inspection circuit board and formed of a conductive elastomer. Each of the layer connector members is brought into simultaneous contact with a plurality of connecting electrodes at one side thereof to be electrically connected thereto, and at the other side thereof, brought into simultaneous contact with a plurality of electrodes to be inspected to be electrically connected thereto. In this measurable state, two connecting electrodes are used for current supply and for voltage measurement, thereby performing measurement of electric resistance on a specified electrode to be inspected.

Another electric resistance measuring apparatus includes a connector member provided on the surface of the inspection circuit board. The connector member is composed of an insulating base, front-side terminals, back-side terminals and a short-circuit member for electrically connecting the adjacent front-side terminals to each other.

30 Claims, 20 Drawing Sheets

ELECTRIC RESISTANCE MEASURING APPARATUS AND METHOD FOR CIRCUIT BOARD

BACKGROUND OF THE INVENTION

1. Field of the Invention

The present invention relates to electric resistance measuring apparatus and methods for circuit boards.

2. Description of the Background Art

In the electrical inspection of circuit boards, it is generally conducted to measure electric resistance between electrodes in the circuit boards.

In the measurement of such electric resistance, there has heretofore been adopted means for finding the value of electric resistance between electrodes 91, 92 to be inspected, which are electrically connected to each other in a circuit board 90 to be inspected, for example, as illustrated in FIG. 28, in which probes PA, PD for current supply and probes PB, PC for voltage measurement are pressed against and contacted with the respective electrodes 91, 92, respectively, a current is supplied between the probes PA, PD for current supply from an electric power unit 93 in this state, and a voltage signal detected by the probes PB, PC for voltage measurement at this time is processed in an electric signal processing unit 94.

However, in the above-described method, it is necessary to bring the probes PA, PD for current supply and the probes PB, PC for voltage measurement into contact with the respective electrodes 91, 92 by considerably great pressing force. In addition, since the probes are made of a metal, and their tips are in the form of a spire, the surfaces of the electrodes 91, 92 are damaged by pressing the respective probes against them, so that such a circuit board becomes unusable. By such circumstances, the measurement of electric resistance cannot be performed on every circuit board as product, so that the measurement cannot but be conducted as the so-called sampling inspection, and the yield of the products cannot be made higher after all.

In order to solve such a problem, there has been proposed an electric resistance measuring apparatus in which elastic connecting members formed of conductive rubber, in which conductive particles are bonded in an elastomer, are respectively arranged on electrodes for current supply and electrodes for voltage measurement (see Japanese Patent Application Laid-Open No. 26446/1997).

According to this electric resistance measuring apparatus, the electrodes for current supply and the electrodes for voltage measurement are pressed against and contacted with electrodes to be inspected in a circuit board to be inspected through the elastic connecting members, thereby achieving electrical connection. Therefore, the measurement of electric resistance can be performed without damaging the electrodes to be inspected.

However, the above-described electric resistance measuring apparatus for circuit boards involves the following problems. Namely, in recent years, the size and pitch or electrode clearance of electrodes have tended to become small in circuit boards in order to high degree of integration is achieved. However, the above-described electric resistance measuring apparatus for circuit boards requires to bring the elastic connecting members related to the electrodes for current supply and the elastic connecting members related to the electrodes for voltage measurement into contact with the respective electrodes in such a circuit board at the same time. Accordingly, when the electric resistance measuring apparatus for circuit boards is used in measurement of electric resistance between electrodes in a circuit board in which electrodes are arranged at high density, it is necessary to form an electrode for current supply as well as an electrode for voltage measurement for each of electrodes to be inspected, which are small in size, and in a state spaced away from each other within a region of an area equal to or smaller than the region occupied by the electrode to be inspected, namely, to form an electrode for current supply and an electrode for voltage measurement, which are smaller in size than the electrode to be inspected, in a state spaced away from each other at an extremely short distance. In addition, it is also necessary to form 2 elastic connecting members independently of each other on the surface of the electrode for current supply and the electrode for voltage measurement, namely, to form elastic connecting members, which are smaller in size than the electrode to be inspected, in a state spaced away from each other at an extremely short distance.

However, it is extremely difficult to do so, and after all, it is extremely difficult to produce an electric resistance measuring apparatus for circuit boards, which is suitable for use in measurement of electric resistance in a circuit board having small-sized electrodes at high density.

SUMMARY OF THE INVENTION

The present invention has been made on the basis of the foregoing circumstances and has as its first object the provision of an electric resistance measuring apparatus for circuit boards, which can perform expected measurement of electric resistance on electrodes to be inspected in a circuit board, even when the size and pitch or electrode clearance of the electrodes are small, without damaging such electrodes, and is easy to produce.

The second object of the present invention is to provide an electric resistance measuring method for circuit boards, which can perform expected measurement of electric resistance on electrodes to be inspected in a circuit board, even when the size and pitch or electrode clearance of the electrodes are small, without damaging such electrodes, and in which an electric resistance measuring apparatus for circuit boards used in this method is easy to produce.

The third object of the present invention is to provide an electric resistance measuring apparatus for circuit boards, which can perform expected measurement of electric resistance on electrodes to be inspected in a circuit board, even when the size of the electrodes is small, with high precision, and is easy to produce.

The fourth object of the present invention is to provide an electric resistance measuring apparatus for circuit boards, which can perform measurement of electric resistance on electrodes to be inspected with high precision without damaging such electrodes.

The fifth object of the present invention is to provide an electric resistance measuring method for circuit boards, which can perform expected measurement of electric resistance on electrodes to be inspected in a circuit board, even when the size of the electrodes is small, with high precision.

In the first aspect of the present invention, there is provided an electric resistance measuring apparatus for circuit boards, which comprises a one-side inspection circuit board arranged on one side of a circuit board to be inspected, at which electrodes to be inspected are located, and having a plurality of connecting electrodes at its surface, and layer connector members provided on the surface of the one-side inspection circuit board and formed of a conductive elastomer, wherein:

each of the layer connector members is brought into simultaneous contact with all connecting electrodes belonging to one group consisting of a plurality of connecting electrodes, which are adjacent to each other, among the connecting electrodes at one side thereof to be electrically connected thereto, and at the other side thereof, brought into simultaneous contact with all electrodes to be inspected belonging to one group consisting of a plurality of electrodes to be inspected, which are adjacent to each other, among the electrodes to be inspected on said one side of the circuit board to be inspected to be electrically connected thereto, thereby forming a measurable state, and in this measurable state, one of two electrodes of the connecting electrodes belonging to the group of the connecting electrodes is used as an electrode for current supply, and the other is used as an electrode for voltage measurement, thereby performing measurement of electric resistance related to a specified electrode specified from among the electrodes belonging to the group of the electrodes to be inspected.

In the electric resistance measuring apparatus, an electric resistance value between the specified electrode to be inspected and the electrode for current supply and an electric resistance value between the specified electrode to be inspected and the electrode for voltage measurement may preferably be both 100 kΩ or lower in the measurable state.

In the electric resistance measuring apparatus according to the first aspect, the layer connector members may preferably be formed integrally on the front side of the inspection circuit board and be each held, at one surface thereof, in a state brought into simultaneous contact with all the connecting electrodes of the group consisting of a plurality of the connecting electrodes, which are adjacent to each other, among the connecting electrodes on the inspection circuit board to be electrically connected thereto.

The electric resistance measuring apparatus according to the first aspect may preferably further comprise an other-side inspection circuit board arranged on the other side opposite to said one side of the circuit board to be inspected, at which the electrodes to be inspected are present, wherein the other-side inspection circuit board has a terminal electrode for current supply and a terminal electrode for voltage measurement which are formed correspondingly to each of grid electrodes formed on the other side of the circuit board to be inspected and are brought into contact under pressure with the grid electrode through a common elastic connecting member.

In an aspect of the present invention, there is provided an electric resistance measuring method for circuit boards, which comprises using the electric resistance measuring apparatus for circuit boards according to the first aspect, wherein:

each of the layer connector members on the one-side inspection circuit board is brought into simultaneous contact with all connecting electrodes belonging to one group consisting of a plurality of connecting electrodes, which are adjacent to each other, among the connecting electrodes at one side thereof to be electrically connected thereto, and at the other side thereof, brought into simultaneous contact with all electrodes to be inspected belonging to one group consisting of a plurality of electrodes to be inspected, which are adjacent to each other, among the electrodes to be inspected on said one side of the circuit board to be inspected to be electrically connected thereto, thereby forming a measurable state, and in this measurable state, one of two electrodes of the connecting electrodes belonging to the group of the connecting electrodes is used as an electrode for current supply, and the other is used as an electrode for voltage measurement, thereby performing measurement of electric resistance related to a specified electrode specified from among the electrodes belonging to the group of the electrodes to be inspected.

In the electric resistance measuring method for circuit board, two connecting electrodes having the lowest electric resistance to the specified electrode to be inspected in the measurable state may preferably be selected to use one of them as an electrode for current supply and the other as an electrode for voltage measurement.

In a second aspect of the present invention, there is provided an electric resistance measuring apparatus for circuit boards, which comprises a one-side inspection circuit board arranged on one side of a circuit board to be inspected, and having a plurality of connecting electrodes, which are arranged correspondingly to each of a plurality of electrodes to be inspected on said one side of the circuit board to be inspected, at its surface, and a connector member provided on the surface of the one-side inspection circuit board, wherein:

the connector member is composed of an insulating base in the form of a sheet or plate, a plurality of front-side terminals arranged correspondingly to the electrodes to be inspected on said one side of the circuit board to be inspected on the front surface of the insulating base, back-side terminals arranged on the back surface of the insulating base respectively contacting with the connecting electrodes on the one-side inspection circuit board and electrically connected respectively to the front-side terminals, and a short-circuit member for electrically connecting the adjacent front-side terminals to each other, which is provided on the front surface of the insulating base, the front-side terminals of the connector member are respectively brought into contact with the electrodes to be inspected on said one side of the circuit board to be inspected, thereby electrically connecting each of the electrodes to be inspected to a plurality of the connecting electrodes through the connector member to form a measurable state, and in this measurable state, two electrodes of a plurality of the connecting electrodes electrically connected to a specified electrode to be inspected on said one side of the circuit board to be inspected are selected to use one of them as an electrode for current supply and the other as an electrode for voltage measurement, thereby performing measurement of electric resistance related to the specified electrode.

In the electric resistance measuring apparatus according to the second aspect, the front-side terminals and the back-side terminals may preferably be formed of a conductive elastomer.

It may be preferred that the short-circuit member be formed of a conductive plate having holes adapted to the front-side terminals at positions corresponding to the front-side terminals, and the front-side terminals are provided in a state that the surface of each front-side terminal is projected from the surface of the short-circuit member, or that the short-circuit member be formed of an insulating plate having holes adapted to the front-side terminals at positions corresponding to the front-side terminals, and a metal layer formed on the surface thereof, and the front-side terminals are provided in a state that the surface of each front-side terminal is projected from the surface of the short-circuit member.

In the electric resistance measuring apparatus for circuit boards according to the second aspect, the insulating base may preferably be formed of an elastic polymeric substance. The front-side terminals and the back-side terminals may preferably be electrically connected to each other by a metallic conductor extending through in the thickness-wise direction of the insulating base. An electric resistance value between the adjacent front-side terminals electrically connected by the short-circuit member may preferably be 1 Ω or lower.

In the electric resistance measuring apparatus according to the second aspect, it may also be preferred that the connector member has a conductor made of a conductive elastomer, said conductor extending through in the thickness-wise direction of the insulating base and being formed so as to project from the surface of the insulating base, the front-side terminals are formed by an end on the front side of the conductor, and the back-side terminals are formed by an end on the back side of the conductor.

The electric resistance measuring apparatus for circuit boards according to the second aspect may preferably further comprise an other-side inspection circuit board arranged on the other side of the circuit board to be inspected, wherein the other-side inspection circuit board has, on the surface thereof, a terminal electrode for current supply and a terminal electrode for voltage measurement which are arranged with a space from each other correspondingly to each of electrodes to be inspected on the other side of the circuit board to be inspected and are electrically connected to the same electrode to be inspected on the other side.

In another aspect of the present invention, there is provided an electric resistance measuring method for circuit boards, which comprises using the electric resistance measuring apparatus for circuit boards according to the second aspect, wherein:

the front-side terminals of the connector member in the one-side inspection circuit board are respectively brought into contact with the electrodes to be inspected on said one side of the circuit board to be inspected to be electrically connected thereto, thereby electrically connecting each of the electrodes to be inspected to a plurality of the connecting electrodes through the connector member to form a measurable state, and in this measurable state, two electrodes of a plurality of the connecting electrodes electrically connected to a specified electrode to be inspected on said one side of the circuit board to be inspected are selected to use one of them as an electrode for current supply and the other as an electrode for voltage measurement, thereby performing measurement of electric resistance related to the specified electrode on said one side of the circuit board to be inspected.

In the electric resistance measuring apparatus according to the first aspect, the layer connector member is commonly electrically connected to a plurality of the connecting electrodes belonging to a group of connecting electrodes in the measurable state, and at the same time held in a state commonly electrically connected to a plurality of the electrodes to be inspected belonging to a group of the electrodes to be inspected, and a specific electrode to be inspected among the group of the electrodes to be inspected can be electrically specified by a tester for inspection. Therefore, one connecting electrode among the group of the connecting electrodes, and another one are used as an electrode for current supply and an electrode for voltage measurement, respectively, whereby a voltage signal about the specific electrode to be inspected can be detected, and consequently the measurement of its electric resistance can be performed.

Since the layer connector member made of a conductive elastomer is brought into contact with the electrodes to be inspected, the electrodes to be inspected can be prevented from being damaged. In addition, the layer connector member comes into simultaneous contact with all the electrodes of the group consisting of a plurality of electrodes to be inspected, which are adjacent to each other, among the electrodes to be inspected in the circuit board to be inspected and is hence naturally greater in size than the individual electrodes to be inspected. Accordingly, the layer connector member can be easily formed, so that the electric resistance measuring apparatus can be produced with extreme ease.

In the electric resistance measuring apparatus for circuit boards according to the second aspect, the adjacent front-side terminals in the connector member are electrically connected to each other by the short-circuit member arranged on the surface of the insulating base in the connector member, so that when a front-side terminal corresponding to a certain electrode to be inspected on one side of the circuit board to be inspected comes into contact with said electrode to be inspected, such an electrode to be inspected on said one side is simultaneously electrically connected to a plurality of the connecting electrodes through the connector member. Accordingly, one of the plurality of the electrodes to be inspected on said one side is specified, and 2 connecting electrodes are selected from among the plurality of the connecting electrodes electrically connected to the specified electrodes to be inspected on said one side to use one of them as an electrode for current supply and the other as an electrode for voltage measurement, whereby a voltage signal about the specified electrode to be inspected can be detected, so that the measurement of electric resistance as to the circuit board to be inspected can be performed with high precision.

Since the connecting electrodes and front-side terminals are in corresponding relation of one to one with the electrodes to be inspected on one side of the circuit board to be inspected, these electrodes are allowed to have a large size as substantially equal to the electrodes to be inspected. Accordingly, even when the size of the electrodes to be inspected on one side of the circuit board to be inspected is small, the connecting electrodes and front-side terminals can be formed with ease, so that the electric resistance measuring apparatus can be produced with extreme ease.

When the front-side terminals brought into contact with the electrodes to be inspected on one side of the circuit board to be inspected in the connector member are formed of a conductive elastomer, the electrodes to be inspected are not damaged even when the front-side terminals are brought into respective contact under pressure with the electrodes to be inspected.

BRIEF DESCRIPTION OF THE DRAWINGS

The above and other objects, features and advantages of the present invention will become apparent from the following description and the appended claims, taken in conjunction with the accompanying drawings, in which:

DETAILED DESCRIPTION OF THE PREFERRED EMBODIMENTS

The embodiments of the present invention will hereinafter be described in details.

Figure 1:
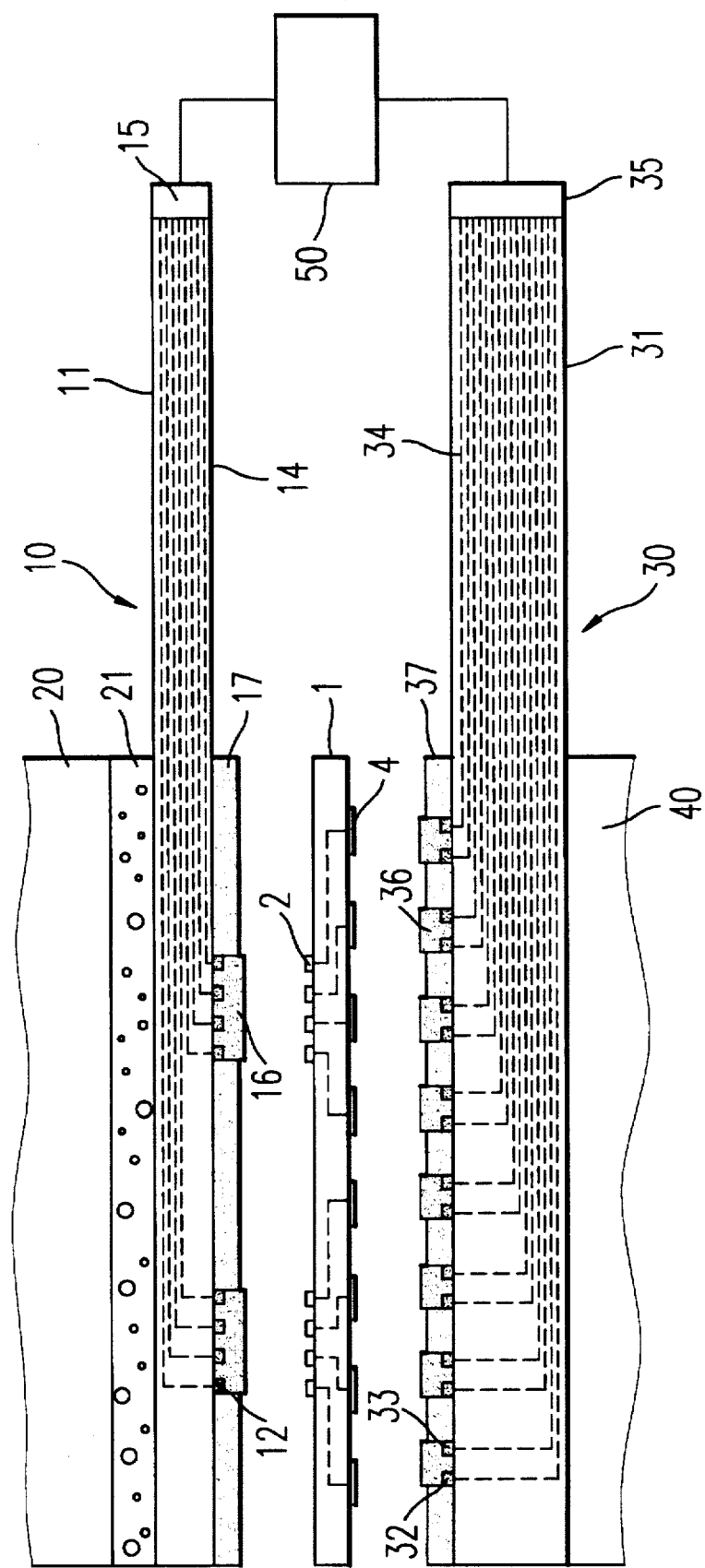
FIG. 1 is a cross-sectional view schematically illustrating the construction of an exemplary electric resistance measuring apparatus according to the first aspect of the present invention together with a circuit board to be inspected.

[A] Electric resistance measuring apparatus according to the first aspect:

FIG. 1 illustrates the construction of an exemplary electric resistance measuring apparatus according to the first aspect of the present invention.

In this electric resistance measuring apparatus, an upper-side adapter 10 arranged on the upper side of a circuit board to be inspected (hereinafter referred to as "board to be inspected") 1 and having an inspection circuit board or one-side inspection circuit board 11, and a lower-side adapter 30 arranged on the lower side of the board 1 to be inspected and having an inspection circuit board or other-side inspection circuit board 31 are vertically arranged. in opposed relation to each other.

Figure 2:
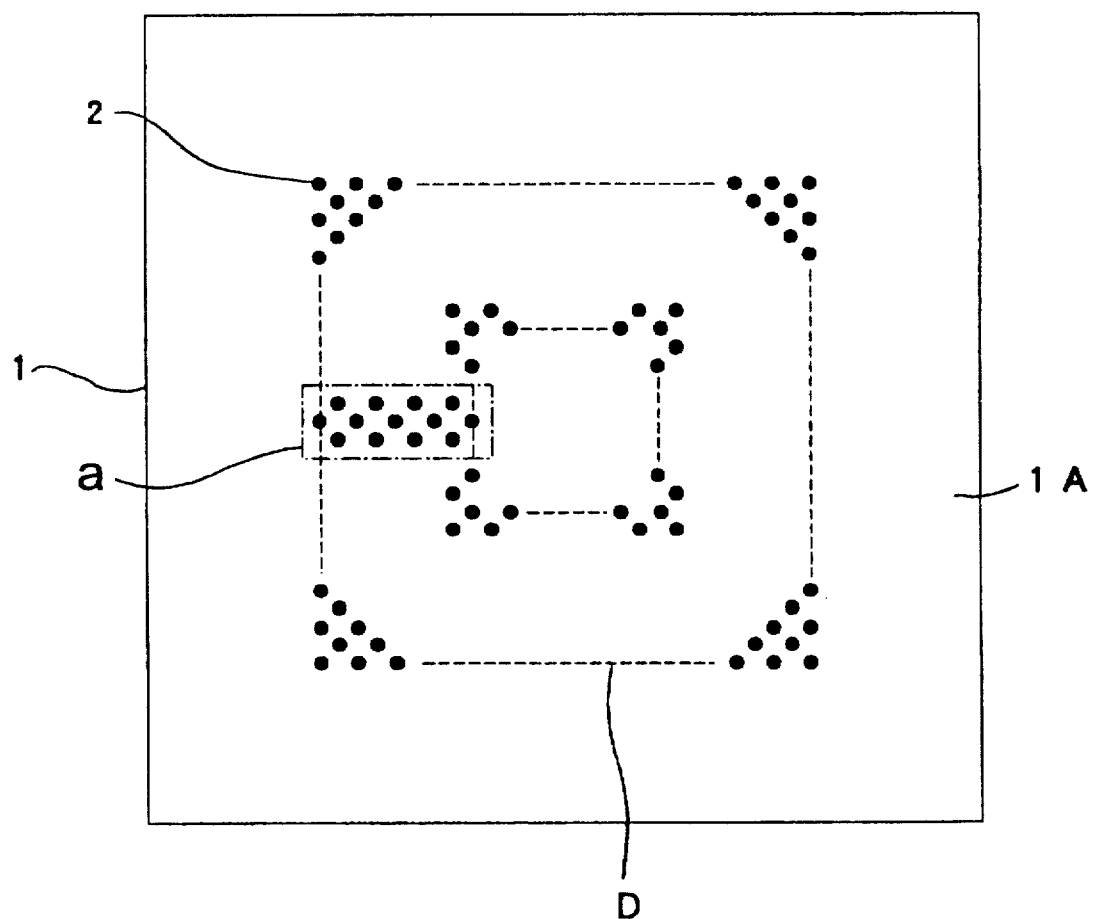
FIG. 2 illustrates the state of dot electrodes arranged on the upper surface of the circuit board to be inspected.
Figure 3:
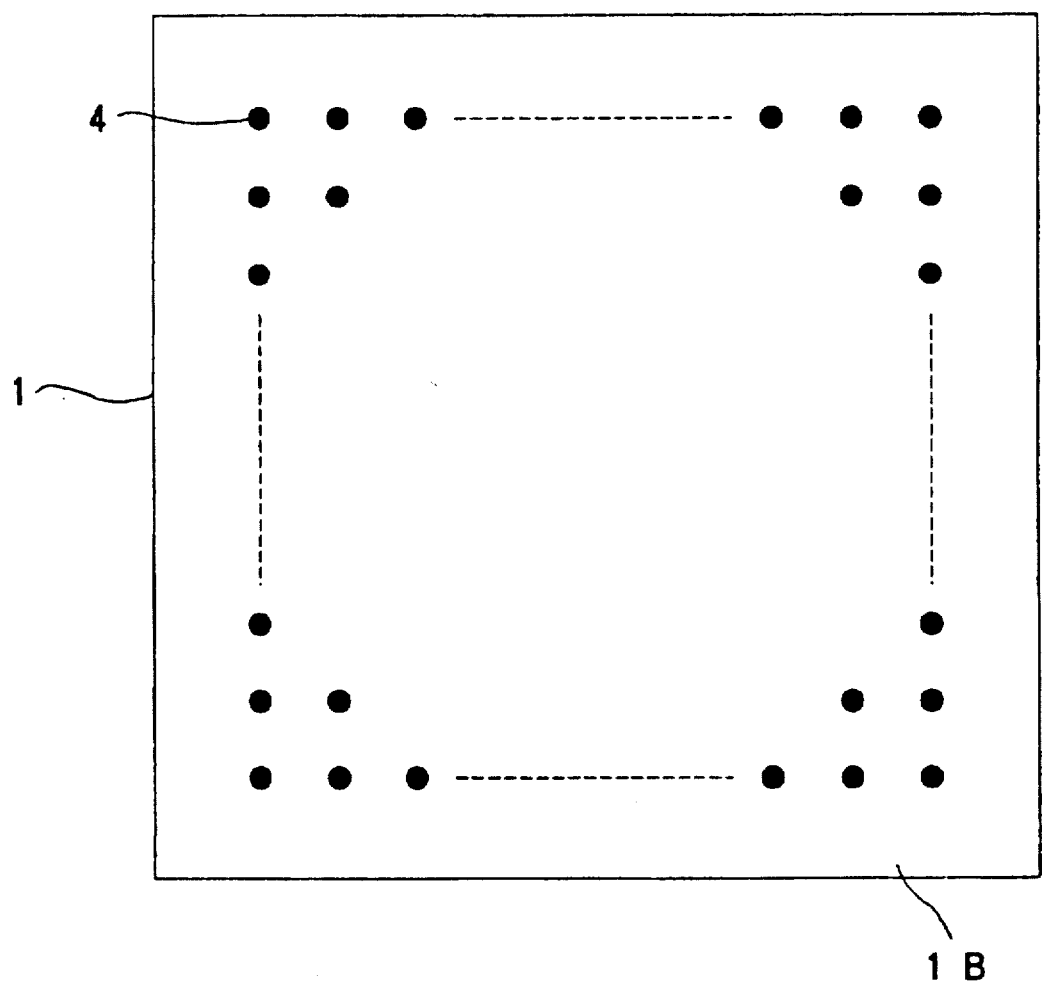
FIG. 3 illustrates the state of grid electrodes arranged on the lower surface of the circuit board to be inspected.

The board 1 to be inspected in this embodiment has, on the upper surface 1A thereof, a great number of small dot electrodes or electrodes 2 to be inspected on one side of the board to be inspected, which are arranged at high density in a dot-electrode arranging region D in the form of a square frame in the central part as illustrated in FIG. 2, and on the lower surface 1B thereof, a great number of grid electrodes or electrodes 4 to be inspected on the other side, which are arranged at positions of, for example, lattice points according to the general standard as illustrated in FIG. 3. These grid electrodes 4 are electrically connected to their corresponding dot electrodes 2, respectively.

On the upper surface of the inspection circuit board 11 in the upper-side adapter 10, is arranged a pressing plate 20 for pressing the upper-side adapter 10 downward through an elastic cushioning plate 21 made of, for example, foamed polyurethane, foamed rubber or the like to lower it. On the other hand, a pressing plate 40 for pressing the lower-side adapter 30 upward to lift it is arranged on the lower surface of the inspection circuit board 31 in the lower-side adapter 30.

In the inspection circuit board 11 in the upper-side adapter 10, connecting electrodes 12 are formed correspondingly to the arrangement pattern of the dot electrodes 2 in the board 1 to be inspected and electrically connected to a tester 50 through their corresponding wiring circuits 14 and a terminal connector 15.

Figure 4A:
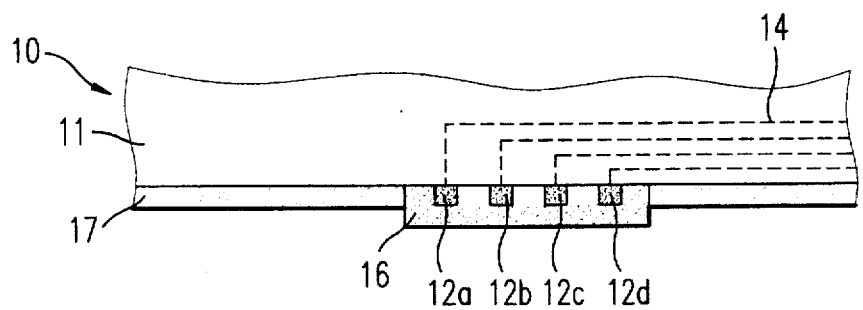
FIG. 4 is a cross-sectional view, on an enlarged scale, illustrating a portion of FIG. 1.
Figure 4B:
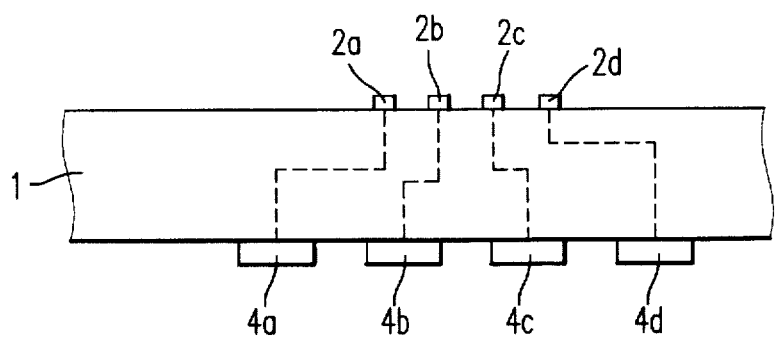
Figure 4C:
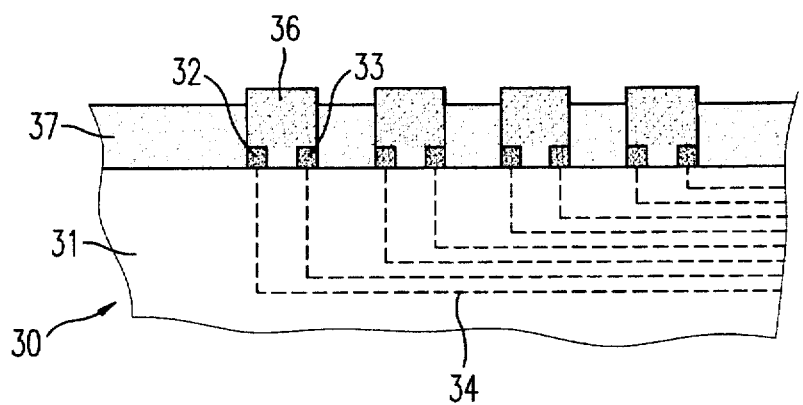

FIG. 4 is an enlarged view illustrating portions of the upper-side adapter 10, lower-side adapter 30 and board 1 to be inspected shown in FIG. 1. As illustrated in this drawing, on the inspection circuit board 11 of the upper-side adapter LO, is provided a layer connector member 16 which is held in a state that it is electrically connected to and in simultaneous contact with all connecting electrodes 12 belonging to each group consisting of a plurality of connecting electrodes (4 electrodes in the case illustrated in FIG. 4) 12a, 12b, 12c, 12d, which are adjacent to each other, among the connecting electrodes 12.

Similarly, other layer connector members 16 are provided for other groups of connecting electrodes. These layer connector members 16 are integrally held on the inspection circuit board 11 by a sheet-like holding member 17 provided on the lower surface of the inspection circuit board 11 in a state that their lower end faces project from the surface of the holding member 17.

In the above, the connecting electrodes 12a to 12d belonging to one group are arranged correspondingly to the arrangement pattern. of a plurality of dot electrodes 2a, 2b, 2c, 2d, which are adjacent to each other, among the dot electrodes 2. Accordingly, these dot electrodes 2a to 2d are plural electrodes (4 electrodes in the case illustrated in FIG. 4) present within a certain region selected, and a group of electrodes to be inspected is constituted by these electrodes.

Incidentally, reference characters 4a, 4b, 4c and 4d indicate grid electrodes electrically connected to the dot electrodes 2a, 2b, 2c and 2d in the board 1 to be inspected, respectively.

Each layer connector member 16 is formed by a conductive elastomer. The conductive elastomer may be formed of, for example, an elastic polymeric substance having insulating property with conductive particles dispersed therein and is required to have conductivity in both directions of its thickness-wise direction and plane direction perpendicular to the thickness-wise direction in a measurable state. It is further preferred that the conductivity in the thickness-wise direction be higher.

The term "measurable state" as used herein means a state that the board 1 to be inspected is held under pressure between the upper-side adapter 10 and the lower-side adapter 30, whereby the layer connector members 16 are pressed against the board to be inspected in the thickness-wise direction thereof.

The conductive elastomer constituting the layer connector member 16 may either have anisotropic property or have no anisotropic property, but is preferably an anisotropically conductive elastomer of the type that the conductivity is exhibited when it is pressed in that such an elastomer is low in electric resistance in the pressurizing direction.

The holding member 17 is preferably formed by an elastic polymeric substance, and a substance which is the same as or similar to the elastic polymeric substance constituting the layer connector member 16 is preferably used practically.

As the elastic polymeric substance forming the layer connector member 16, is preferred a polymeric substance having a crosslinked structure. As examples of a curable polymeric material usable for obtaining the crosslinked polymeric substance, may be mentioned silicone rubber, polybuladiene, natural rubber, polyisoprene, styrene-butadiene copolymer rubber, acrylonitrile-butadiene copolymer rubber, ethylene-propylene copolymer rubber, urethane rubber, polyester rubber, chloroprene rubber, epichlorohydrin rubber and soft liquid epoxy resins.

Specifically, the layer connector member 16 can be formed, for example, by subjecting a fluid material comprising a polymeric substance forming material, which will form an insulating elastic polymeric substance by curing and conductive particles dispersed therein, to a curing treatment. In this case, there may preferably be used a polymeric material which is liquid before the curing treatment and becomes solid while retaining the state closely contacted with or adhesion-bonded to the inspection circuit board 11 after the curing treatment. As examples of preferable polymeric materials, may be mentioned liquid silicone rubber, liquid urethane rubber and soft liquid epoxy resins. An additive such as a silane coupling agent or titanium coupling agent may be added to the polymeric material for the purpose of enhancing the adhesive property to the inspection circuit board 11.

On the other hand, no particular limitation is imposed on the conductive particles dispersed in the elastic polymeric substance. However, conductive particles composed of, for example, a magnetic material are preferred because they can be dispersed in the elastic polymeric substance in a state oriented so as to be arranged in the thickness-wise direction by utilizing a magnetic field, and a preferable anisotropically conductive elastomer can be provided.

As specific examples of the particles of the conductive magnetic material, may be mentioned particles of metals exhibiting magnetism, such as nickel, iron and cobalt, and particles of alloys thereof; particles obtained by plating these particles with gold, silver, palladium, rhodium or the like; and particles obtained by plating particles of non-magnetic metals, inorganic particles such as glass beads or polymer particles with a conductive magnetic material such as nickel or cobalt. Particles formed of conductive superparamagnetic material may also be preferably used in that no magnetic hysterisis is exhibited.

In a process for forming the layer connector member 16, which will be described subsequently, particles of a conductive magnetic material such as nickel, iron or an alloy thereof are used, and particles plated with gold may preferably used from the viewpoint of electrical properties such as low contact resistance.

The particle diameter of the conductive particles is preferably 3 to 200 μm, particularly 10 to 100 μm in order that deformation under pressure of the layer connector member 16 is made easy, and sufficient electrical contact is achieved among the conductive particles in the layer connector member 16.

The layer connector member 16 can be formed on the inspection circuit board 11, preferably, in a manner described below.

Figure 5:
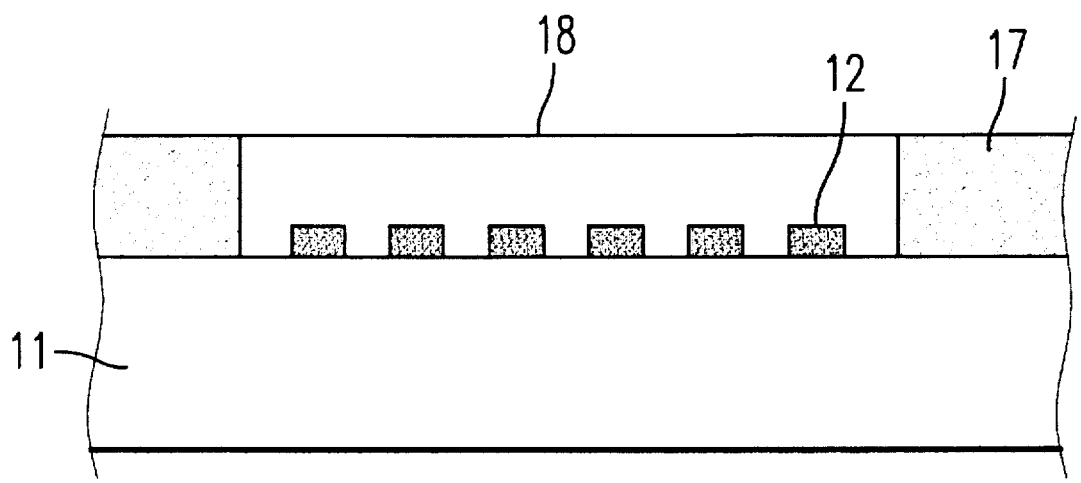
FIG. 5 illustrates a state that a holding member having through-holes has been formed on an inspection circuit board.

As illustrated in FIG. 5, a holding member 17 with openings or through-holes 18 formed correspondingly to regions in which a group of connecting electrodes 12 constituting a group of connecting electrodes has been formed is first formed.

Such a holding member 17 is obtained by applying a polymeric material, which will form an insulating elastic polymeric substance by curing, to the inspection circuit board 11, curing this material to form a sheet for the holding member integrally with the inspection circuit board 11 and then forming the through-holes 18 in the necessary regions of the sheet for the holding member by a laser or the like.

Figure 6:
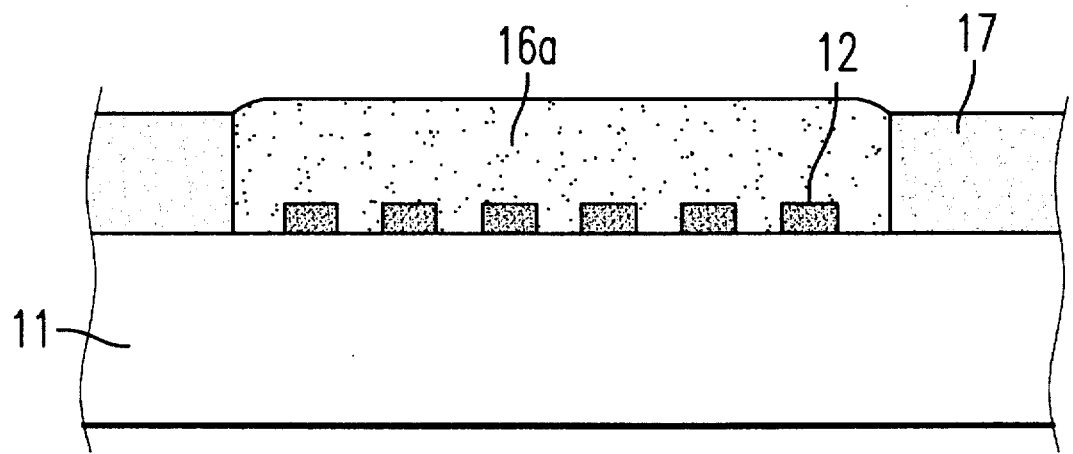
FIG. 6 illustrates a state that a material layer for a layer connector member has been formed in the through-hole in the holding member.

A layer 16A of a material for the layer connector member obtained by dispersing particles of a conductive magnetic material in a polymeric material, which will form an insulating elastic polymeric substance by curing, is then formed in each of the through-holes 18 formed in the holding member 17 as illustrated in FIG. 6, after which the layer 16A is subjected to a curing treatment, thereby forming the layer connector member 16 provided integrally on the inspection circuit board 11 and holding member 17.

The conditions of the curing treatment of the material layer 16A for the layer connector member are suitably selected according to the material used. However, the treatment is generally conducted by a heat treatment. Specific heating temperature and heating time are suitably selected in view of the kind of the polymeric material of the material layer 16A for the layer connector member, the time required for movement of the conductive magnetic particles, and the like. For example, when the polymeric material is a room temperature curing silicone rubber, the curing treatment is performed for about 24 hours at room temperature, for about 2 hours at 40° C. or for about 30 minutes at 80° C.

In this curing treatment, the conductive particles can be oriented by applying a magnetic field to the resulting material layer when the conductive particles are particles of a conductive magnetic material.

In the above, it is not always essential to form the layer connector member 16 integrally with the inspection circuit board 11. For example, an elastomer sheet, in which a single or a plurality of layer connector members 16 has been formed integrally with the holding member 17, may be separately produced in advance, and this sheet may be arranged on the inspection circuit board 11.

The layer connector member in the present invention is such that the thickness is, for example, 50 to 1,000 μm, preferably 100 to 300 μm, the total electric resistance value in the thickness-wise direction in the measurable state is 10 mΩ to 100 kΩ, preferably 10 mΩ to 1 kΩ, particularly preferably 10 mΩ to 10 Ω, and the total electric resistance value per unit length in the plane direction in the measurable state is 10 mΩ/mm to 100 kΩ/mm, preferably 10 mΩ/mm to 10 Ω/mm.

An example of a layer connector member having such electrical properties is such that nickel powder plated with gold is filled in a proportion of 20 to 60% by volume into silicone rubber and oriented and dispersed therein, for example.

On the other hand, on the upper surface of the inspection circuit board 31 in the lower-side adapter 30, a terminal electrode 32 for current supply and a terminal electrode 33 for voltage measurement, which constitute a pair of measuring electrodes, are arranged, according to an arrangement pattern of the grid electrodes 4 (4a, 4b, 4c, 4d in FIG. 4) on the lower side of the board 1 to be inspected, correspondingly to one of grid electrodes 4 so as to be spaced away from each other and exist within a plane region occupied by the grid electrode 4. The terminal electrode 32 for current supply and the terminal electrode 33 for voltage measurement are electrically connected to the tester 50 through their corresponding wiring circuits 34 and a terminal connector 35 in the inspection circuit board 31.

On the upper side of the inspection circuit board 31 in the lower-side adapter 30, are provided common elastic connecting members 36 each of which comes into contact with both surfaces of the terminal electrode 32 for current supply and the terminal electrode 33 for voltage measurement, which constitute a pair of measuring electrodes. The elastic connecting members 36 are held by a sheet-like holding member 37 provided on the upper surface of the inspection circuit board 31 in a state that their upper end faces project from the surface of the holding member 37. In this embodiment, a plurality of the elastic connecting members 36 are, independently of each other, provided correspondingly to the every grid electrodes 4 on the board 1 to be inspected.

The elastic connecting members 36 are preferably formed by, for example, an anisotropically conductive elastomer that exhibits high conductivity in its thickness-wise direction. In such an anisotropically conductive elastomer, for example, conductive particles are filled in an insulating elastic polymeric substance in a state oriented so as to be arranged in the thickness-wise direction (vertical direction in the drawings), thereby exhibiting high conductivity in the thickness-wise direction. In particular, an anisotropically conductive elastomer of the type that conductive paths extending in the thickness-wise direction are formed when pressed and compressed in the thickness-wise direction is preferred.

The elastic connecting members 36 can be formed by, for example, a process similar to the above-described process for forming the layer connector member 16. However, it goes without saying that the conditions varies as needed.

The elastic connecting member 36 preferably has higher conductivity in the thickness-wise direction than that in a plane direction perpendicular to the thickness-wise direction. Specifically, the elastic connecting member 36 preferably has such electrical properties that a ratio of the electric resistance value in the thickness-wise direction to the electric resistance value in the plane direction is lower than 1, particularly 0.5.

If the ratio is 1 or higher, a current flowing between the terminal electrode 32 for current supply and the terminal electrode 33 for voltage measurement through the elastic connecting member 36 becomes large, so that it may be difficult in some cases to measure electric resistance with high precision.

From such a point of view, when the elastic connecting member 36 is formed of the insulating elastic polymeric substance with the conductive particles dispersed therein, the filling rate of the conductive particles is preferably 5 to 50% by volume.

A clearance between the terminal electrode 32 for current supply and the terminal electrode 33 for voltage measurement in the inspection circuit board 31 of the lower-side adapter 30 is preferably at least 10 μm. If this clearance is shorter than 10 μm, a current flowing between the terminal electrode 32 for current supply and the terminal electrode 33 for voltage measurement through the elastic connecting member 36 becomes large, so that it may be difficult in some cases to measure electric resistance with high precision.

On the other hand, the upper limit of the clearance is determined by the sizes of the respective terminal electrodes and the size and pitch of their related grid electrode, and is generally at most 500 μm. If this clearance is too long, it is difficult to suitably arrange both terminal electrodes to one of grid electrodes 4 corresponding to a small-sized dot electrode 2.

In the electric resistance measuring apparatus for circuit boards according to the above-described first aspect, electric resistance between any one of dot electrodes 2 and its corresponding grid electrode 4 in the board 1 to be inspected is measured in the following manner.

The board 1 to be inspected is arranged at the predetermined position between the upper-side adapter 10 and the lower-side adapter 30, and in this state, the upper-side adapter 10 is pressed through the elastic cushioning plate 21 by the pressing plate 20 to lower it, and the lower-side adapter 30 is pressed by the pressing plate 40 to lift it, thereby bringing the layer connector members 16 of the upper-side adapter 10 into contact under pressure with the upper surface of the board 1 to be inspected and at the same time, bringing the elastic connecting members 36 of the lower-side adapter 30 into contact under pressure with the lower surface of the board 1 to be inspected. This state is the measurable state.

The pressing force for achieving this measurable state is such an intensity that the layer connector members 16 or the elastic connecting members 36 are brought into contact with the board to be inspected under pressure of, for example, 0.1 to 10 kgf/cm$^2$, preferably 0.2 to 2 kgf/cm$^2$.

Specifically described in accordance with the case illustrated in FIG. 4, in this state, a group of connecting electrodes, which consists of the connecting electrodes 12a to 12d is electrically connected all at once to a group of dot electrodes, which consists of the dot electrodes 2a to 2d, through the layer connector member 16 on the upper surface of the board 1 to be inspected, and a pair of measuring electrodes, which consists of the terminal electrode 32 for current supply and the terminal electrode 33 for voltage measurement is electrically connected simultaneously to their corresponding grid electrode 4 through the elastic connecting member 36 on the lower surface of the board 1 to be inspected.

When attention is paid to, for example, the dot electrode 2a in this measurable state, connecting electrodes 12 electrically connected to this dot electrode 2a are all the connecting electrodes 12a to 12d in the group of connecting electrodes related to the layer connector member 16, so that the dot electrode 2a cannot be separately treated even when any of the connecting electrodes 12a to 12d is selected.

Since the grid electrodes 4 on the lower surface of the board 1 to be inspected are electrically connected to their corresponding pairs of measuring electrodes each consisting of the terminal electrode 32 for current supply and the terminal electrode 33 for voltage measurement through the elastic connecting member 36, however, any one pair of the measuring electrodes is specified in the tester 50, whereby a specific dot electrode can be specified through its related grid electrode.

When the terminal electrode 32 for current supply and the terminal electrode 33 for voltage measurement related to, for example, the grid electrode 4a are specified as a pair of measuring electrodes in the tester 50, the dot electrode 2a comes to be specified.

On the other hand, a plurality of the connecting electrodes 12a to 12d are electrically connected simultaneously to the dot electrode 2a, so that two of the connecting electrodes are selected in the tester 50 to use them as an electrode for current supply and an electrode for voltage measurement, thereby obtaining a voltage signal between the connecting electrode 12a and the terminal electrode 33 for voltage measurement related to the grid electrode 4a. This voltage signal permits the measurement of electric resistance between the dot electrode 2a and the grid electrode 4a.

Figure 7A:
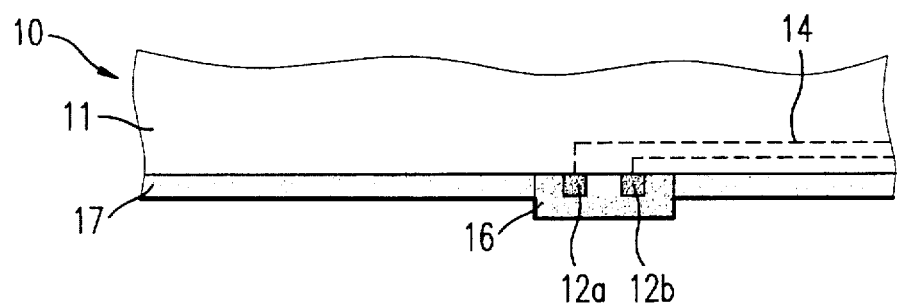
FIG. 7 illustrates a positional relation between a dot electrode, which is an electrode to be inspected, and connecting electrodes in an electric resistance measuring apparatus similar to that shown in FIG. 1.
Figure 7B:
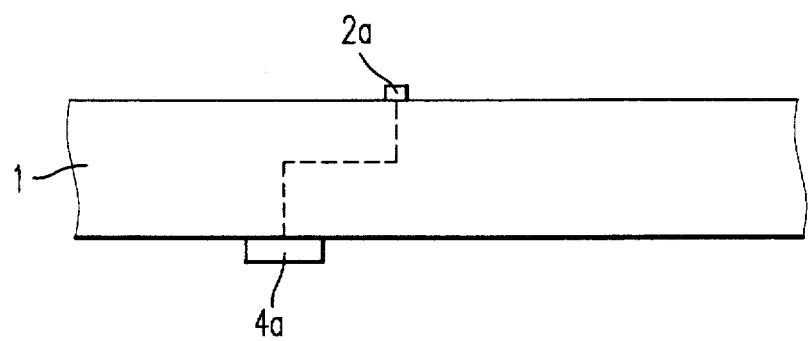
Figure 7C:
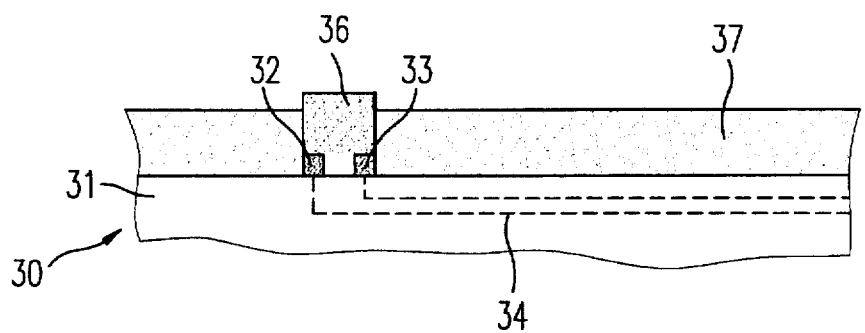

Two connecting electrodes used as a pair of measuring electrodes will be described. In a state that the upper-side adapter 10 is now exactly located to the board 1 to be inspected, and the connecting electrode 12a is located over the position right above the dot electrode 2a as illustrated in FIG. 7, the connecting electrode 12a and the connecting electrode 12b adjacent thereto are preferably used as an electrode for current supply and an electrode for voltage measurement. The reason for this is that these connecting electrodes are two electrodes having the lowest electric resistance value to the dot electrode 2a through the layer connector member 16, so that high precision is given upon the measurement.

Specifically, the electric resistance Ra between the dot electrode 2a and the connecting electrode 12a right above it is electric resistance in the thickness-wise direction of the layer connector member 16 in the measurable state, and the electric resistance Rb between the dot electrode 2a and the adjacent connecting electrode 12b is electric resistance in the thickness-wise direction and plane direction of the layer connector member 16 in the measurable state, so that the electric resistance Ra is lower than the electric resistance Rb. Practically, no obstruction is however caused to the measurement of the intended electric resistance even when there is a difference between both electric resistance values so far as these electric resistance values Ra and Rb are both not higher than 100 kΩ.

Accordingly, two connecting electrodes actually used as the pair of measuring electrodes may be any two electrodes having an electric resistance value of 100 kΩ or lower to the specified dot electrode 2a, and must not be always the electrode 12a located right above the specified dot electrode 2a and the connecting electrode 12 adjacent thereto or two electrodes having the lowest electric resistance value. For example, in the case illustrated in FIG. 4, another combination of any two electrodes selected from among the connecting electrodes 12a to 12d than the combination of the connecting electrodes 12a and 12b may be used as a pair of measuring electrodes for conducting the measurement on the dot electrode 2a.

Since two connecting electrodes 12 having the lowest electric resistance value to a certain dot electrode 2 are two connecting electrodes 12 having the highest current value detected in the tester 50, their selection is extremely easy.

Figure 8A:
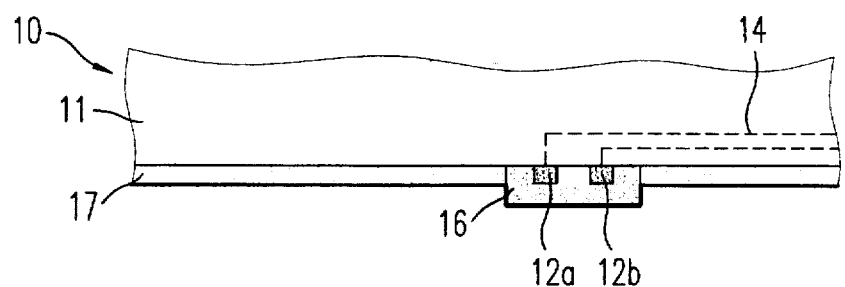
FIG. 8 is a similar view to FIG. 7, which illustrates a state that a positional relation between the dot electrode and the connecting electrodes is different from FIG. 7.
Figure 8B:
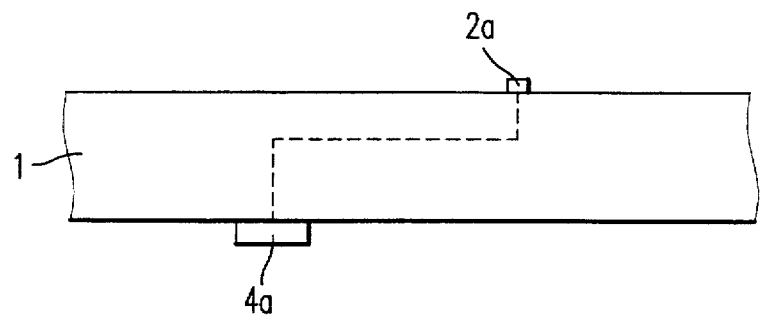

Even when the upper-side adapter 10 is located in a state slightly misregistered to the board 1 to be inspected as illustrated in FIG. 8, and so the corresponding connecting electrode 12a is not located to the position right above the specified dot electrode 2a, but its adjacent connecting electrode 12b is located thereto, the connecting electrode 12b located to the position right above the dot electrode 2a and its adjacent connecting electrode 12a can be used as a pair of measuring electrodes like the case illustrated in FIG. 7.

Figure 9A:
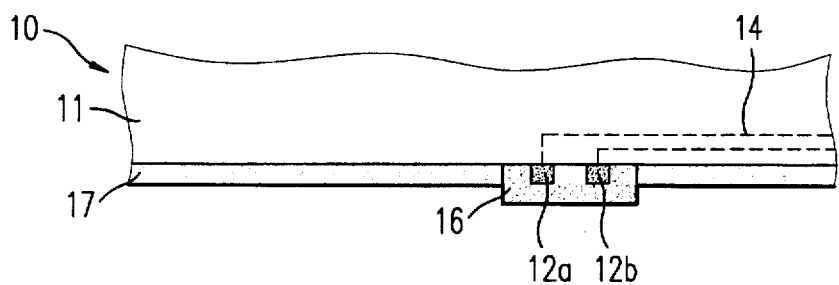
FIG. 9 is a similar view to FIG. 7, which illustrates a state that a positional relation between the dot electrode and the connecting electrodes is different from FIGS. 7 and 8.
Figure 9B:
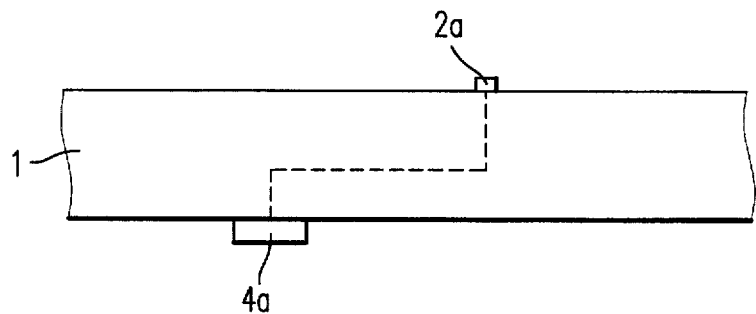

Even when two connecting electrodes 12a and 12b adjacent to each other are located to the specified dot electrode 2a in an electrically equal positional relation to each other as illustrated in FIG. 9, these two connecting electrodes can be used as a pair of measuring electrodes to conduct the measurement of the intended electric resistance on the dot electrode 2a.

As easily understood from the cases illustrated in FIGS. 7 to 9, according to the present invention, it is unnecessary to locate the inspection circuit board 11 with so strict precision that connecting electrodes 12 arranged correspondingly to dot electrodes 2 may be precisely located to the positions right above their corresponding dot electrodes 2, and consequently actual measurement of electric resistance is practiced with ease from this point of view.

In the above-described electric resistance measuring apparatus, two connecting electrodes 12 used as a pair of measuring electrodes preferably have an electric resistance value of at least 10 mΩ between them through the layer connector member 16 held in the measurable state. If the electric resistance is lower than 10 mΩ, a current flowing between them becomes large, so that the measurement of the intended electric resistance cannot be performed with high precision.

According to the electric resistance measuring apparatus for circuit boards of the construction described above, the layer connector member 16 formed of a conductive elastomer is brought into contact under pressure with the dot electrode 2 which is an electrode to be inspected on the upper surface of the board 1 to be inspected, so that a state that the connecting electrodes 12 have been electrically connected to the dot electrode 2 can be achieved with certainty without damaging the dot electrode 2.

In addition, the layer connector member 16 is formed in the size and shape corresponding to the region covering a group of dot electrodes consisting of a plurality of dot electrodes adjacent to each other on the upper surface of the board 1 to be inspected, so that the area of the individual layer connector members 16 may be formed large even when the size of the dot electrodes 2 and the clearance or pitch between adjacent dot electrodes are small. Therefore, such layer connector members 16 can be formed with extreme ease, so that the electric resistance measuring apparatus can be produced with extreme ease.

In the above-described embodiment, the elastic connecting member 36 formed of an anisotropically conductive elastomer is brought into contact under pressure with the grid electrode 4 on the lower surface of the board 1 to be inspected, so that a state that the terminal electrode 32 for current supply and the terminal electrode 33 for voltage measurement have been, independently of each other, electrically connected to the grid electrode 4 can be achieved with certainty without damaging the grid electrode 4.

However, in the electric resistance measuring apparatus described above, it is not essential to construct the inspection circuit board of the lower-side adapter by the terminal electrodes 32 for current supply, the terminal electrodes 33 for voltage measurement and the elastic connecting members 36 as in the examples illustrated in the drawings, but any other construction may be permitted so far as a state that two terminal electrodes constituting a pair of measuring electrodes are electrically connected to a grid electrode 4 can be achieved.

For example, such an anisotropically conductive elastomer that it has a conductive path extending in the thickness-wise direction at positions corresponding to the terminal electrode 32 for current supply and the terminal electrode 33 for voltage measurement, but it is electrically insulated between these conductive paths may also be utilized as the elastic connecting member 36. Terminal electrodes on -the tips of which a conductive elastomer is provided, and further probe pins, if permitted, may also be used as terminal electrodes.

Although the cases where the connecting electrode 12 is provided on the inspection circuit board 11 correspondingly to each of the dot electrodes 2 which are electrodes to be inspected have been described above, it is only necessary in the present invention to realize a state that a plurality of connecting electrodes independent of one another are electrically connected to the electrode to be inspected through the layer connector member 16. Therefore, a plurality of electrodes 1 to be inspected stood in a specific relation may be defined as a unit, and a connecting electrode corresponding to each unit may be formed on an inspection circuit board to form layer connector members correspondingly to the plurality of groups of the connecting electrodes.

Figure 10:
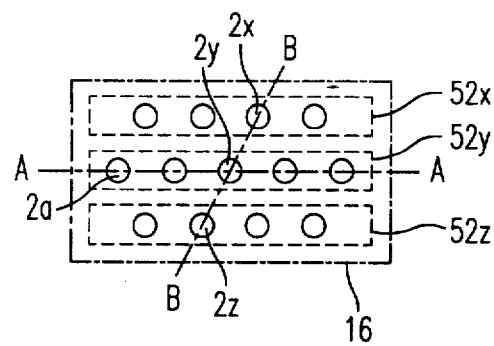
FIG. 10 illustrates a version of the connecting electrodes and layer connector member in another example of the electric resistance measuring apparatus according to the first aspect of the present invention.
Figure 11A:
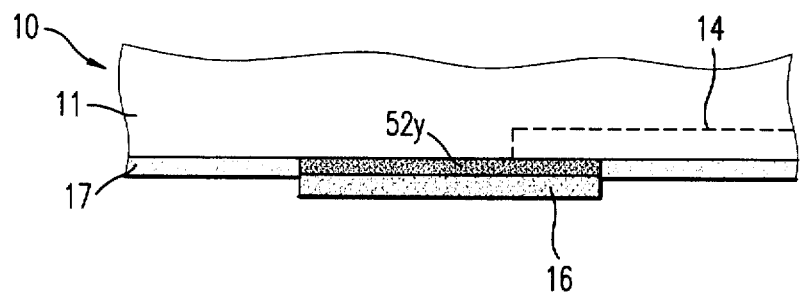
FIG. 11 is an enlarged cross-sectional view taken on line A—A of FIG. 10.
Figure 11B:
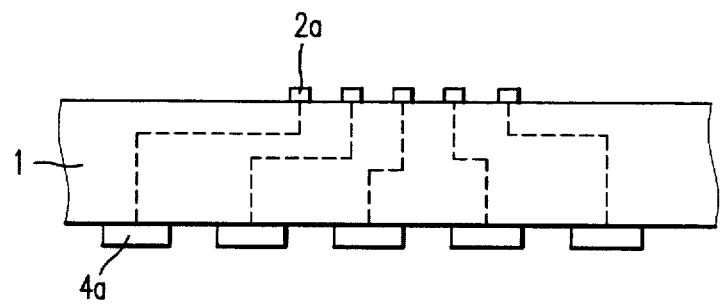
Figure 11C:
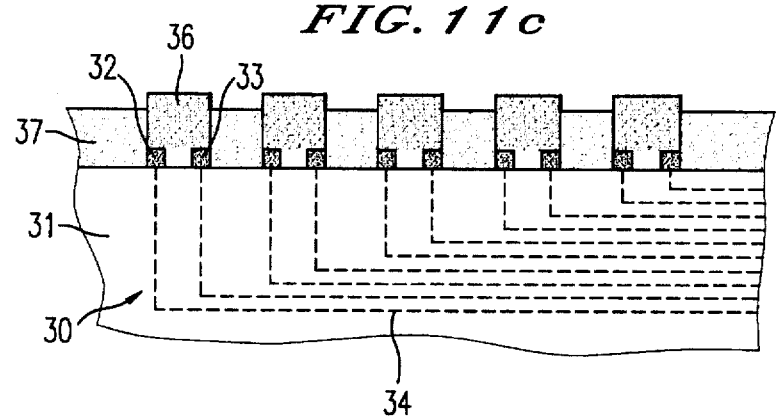
Figure 12A:
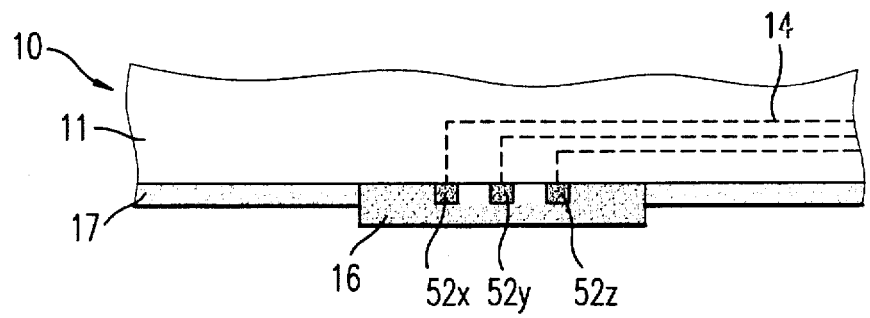
FIG. 12 is an enlarged cross-sectional view taken on line B—B of FIG. 10.
Figure 12B:
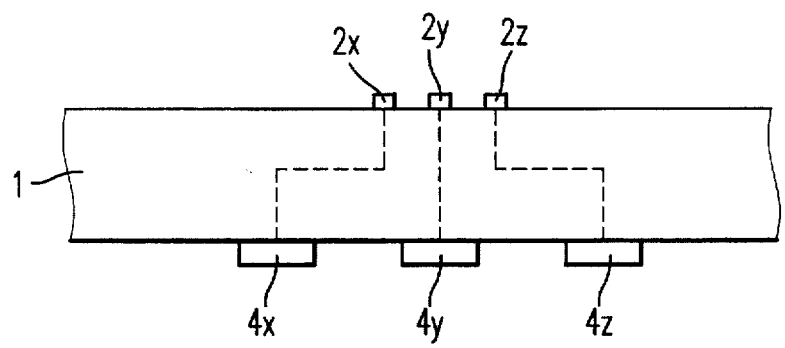
Figure 12C:
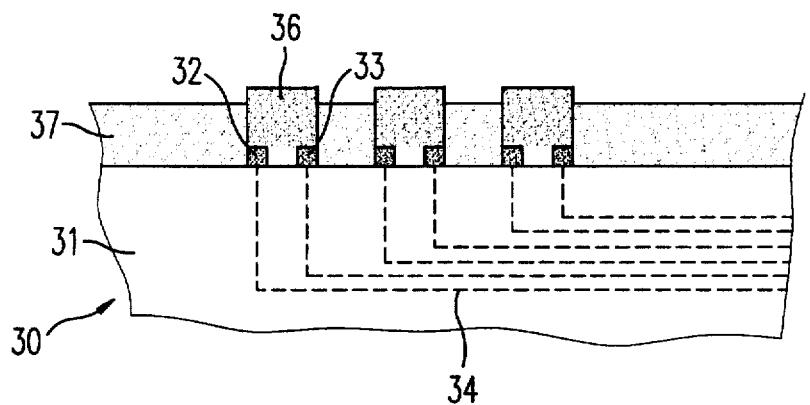

FIG. 10 illustrates such a case. In FIG. 10, dot electrodes 2 which are indicated by white circles and are electrodes to be inspected are arranged in the so-called staggered form on the whole surface, namely, they arranged in a state that they have been located on any of 3 straight lines each extending in the horizontal direction in FIG. 10, and moreover on any of straight lines each extending in a diagonal direction. FIG. 11 is a cross-sectional view taken on line A—A extending in the horizontal direction in FIG. 10, and FIG. 12 is a cross-sectional view taken on line B—B extending in the diagonal direction in FIG. 10. Incidentally, the example of arrangement of dot electrodes 2 in FIG. 10 corresponds to a region a in dot electrode arranging regions illustrated in FIG. 2.

In this example, although 3 sets of plural dot electrodes 2 arranged on the straight line extending in the horizontal direction are formed, common strip-like connecting electrodes 52x, 52y, 52z common to dot electrodes 2 in the respective sets are formed, with each set defined as a unit, on the inspection circuit board 11 independently of other sets in a state spaced away from one another in a plane direction (a state spaced away from one other in vertical direction in FIG. 10) as illustrated in FIG. 11. A layer connector member 16 is formed in a region covering these common connecting electrodes 52.

On the other hand, the lower-side adapter 30 has the same construction as that illustrated in, for example, FIG. 4.

According to the electric resistance measuring apparatus of such a construction, as apparent from the construction illustrated in FIG. 12, 2 common connecting electrodes selected from among the common connecting electrodes 52x to 52z, for example, the common connecting electrodes 52x and 52y are used as an electrode for current supply and an electrode for voltage measurement for, for example, a certain dot electrode 2x, in exactly the same manner as in the case described above, thereby conducting the measurement of the intended electric resistance on the dot electrode 2x.

In this case, as apparent from FIG. 10, each of the region to be occupied by the respective layer connector members 16 is greatly two-dimensionally enlarged, so that it can be formed with extreme ease, and the production of the electric resistance measuring apparatus also becomes very easy.

As easily understood from the respective embodiments described above, a state that at least two connecting electrodes are electrically connected simultaneously to a certain electrode to be inspected through the layer connector member is realized in the present invention. In this state, any one of electrodes to be inspected is electrically specified by a tester, whereby the measurement of the intended electric resistance on the specified electrode to be inspected can be performed.

Figure 13A:
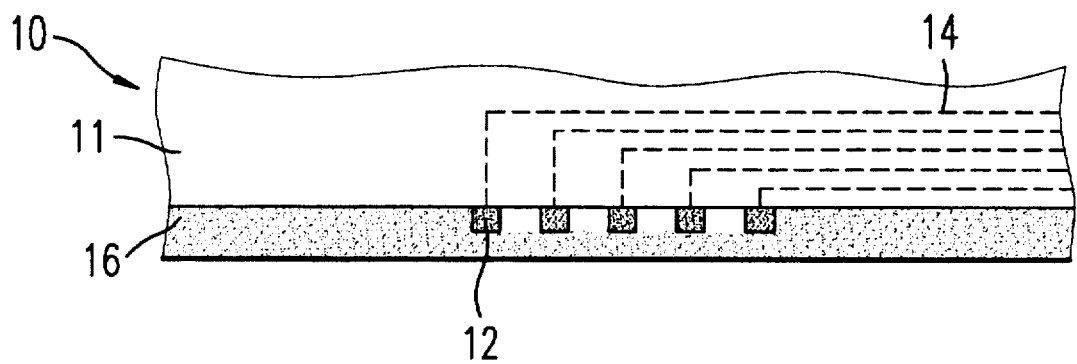
FIG. 13 illustrates a version of the connecting electrodes and layer connector member in a further example of the electric resistance measuring apparatus according to the first aspect of the present invention.
Figure 13B:
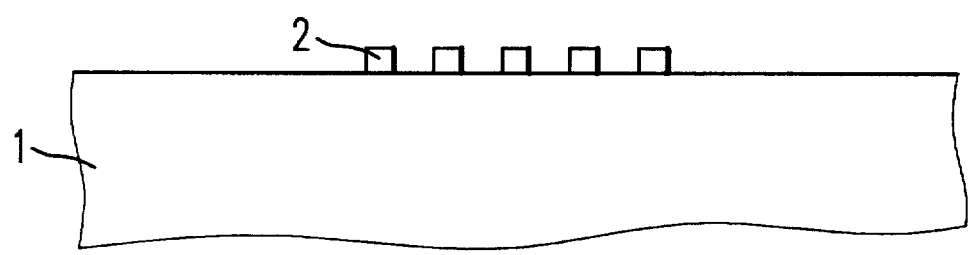

Accordingly, the layer connector member 16 may also be formed in a state covering a wide region on the upper surface of the board 1 to be inspected as illustrated in FIG. 13, so as to be commonly electrically connected to a number of electrodes 2 to be inspected on the upper surface thereof. Further, the layer connector member 16 may be singly constructed so as to cover the whole surface of the board 1 to be inspected to realize a state that all the electrodes to be inspected are electrically connected simultaneously.

In such a case, the layer connector member 16 may also be formed by an anisotropically conductive elastomer sheet separately made. However, it is actually necessary to use 2 electrodes, which satisfy, for example, specific conditions that the electric resistance value is 100 kΩ or lower, among connecting electrodes as the pair of measuring electrodes, otherwise it would be difficult to conduct measurement of the intended electric resistance because an measurement error becomes great.

[B] Electric resistance measuring apparatus according to the second aspect:

First Embodiment

Figure 14:
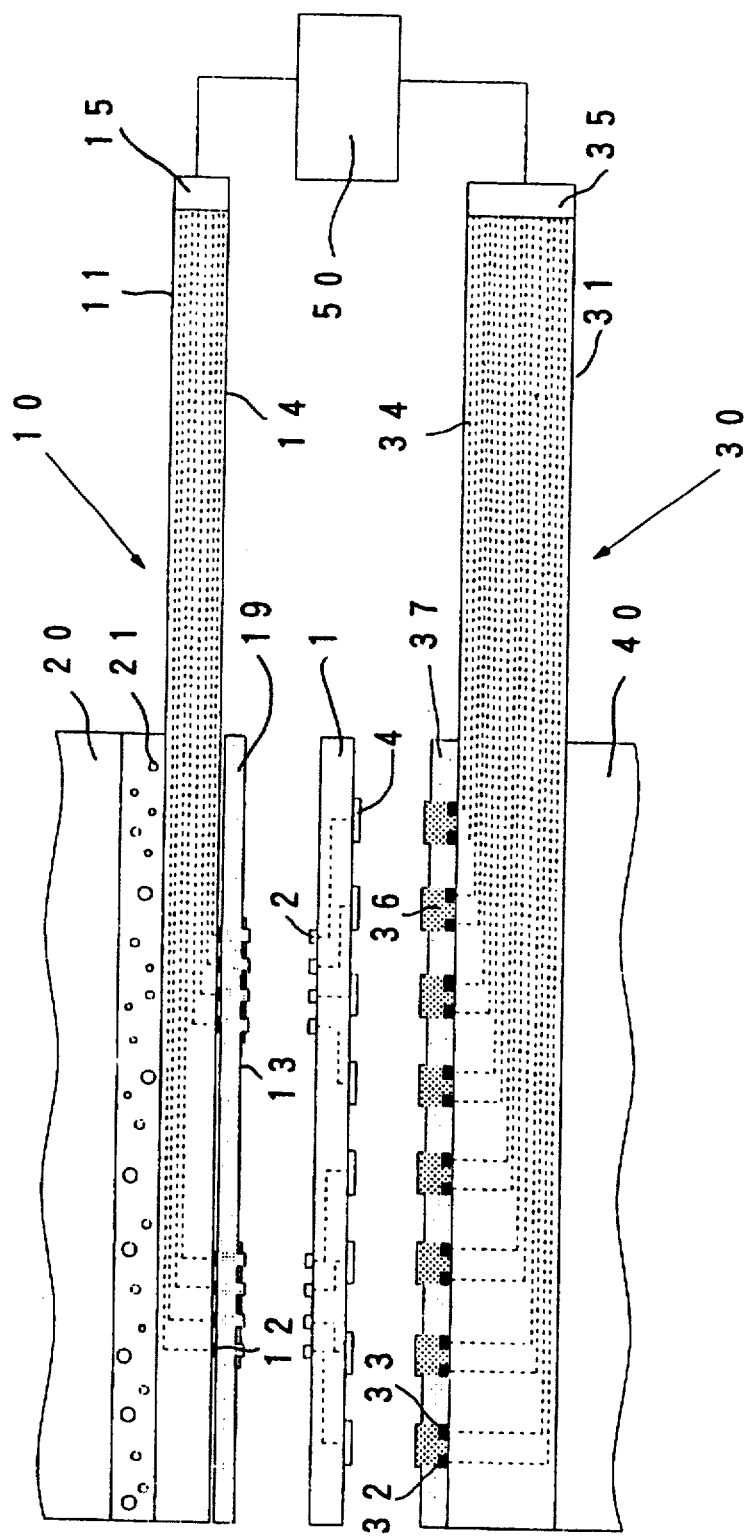
FIG. 14 is a cross-sectional view schematically illustrating the construction of an exemplary electric resistance measuring apparatus according to a first embodiment of the second aspect of the present invention together with a circuit board to be inspected.

FIG. 14 is a cross-sectional view schematically illustrating the construction of an exemplary electric resistance measuring apparatus according to the first embodiment of the second aspect of the present invention together with a circuit board to be inspected.

In this electric resistance measuring apparatus for circuit boards, an upper-side adapter 10 arranged on one side (upper side in FIG. 14) of a circuit board 1 to be inspected and having an inspection circuit board or one-side inspection circuit board 11, and a lower-side adapter 30 arranged on the other side (lower side in FIG. 14) of the circuit board 1 to be inspected and having an inspection circuit board or other-side inspection circuit board 31 are vertically arranged in opposed relation to each other.

The circuit board 1 to be inspected in this embodiment has the same construction as the above-described case illustrated in FIGS. 2 and 3. As with the case illustrated in FIG. 1, an elastic cushioning plate 21 and a pressing plate 20 are arranged on the upper-side adapter 10, while a pressing plate 40 is arranged on the lower-side adapter 30.

Figure 15A:
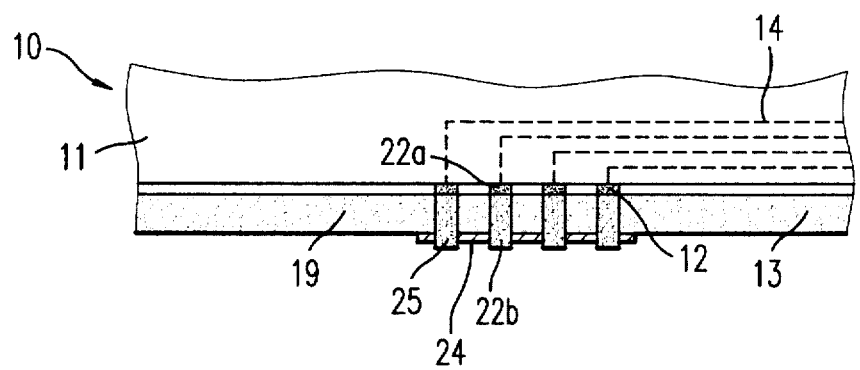
FIG. 15 is a cross-sectional view illustrating the principal part of the electric resistance measuring apparatus shown in FIG. 14
Figure 15B:
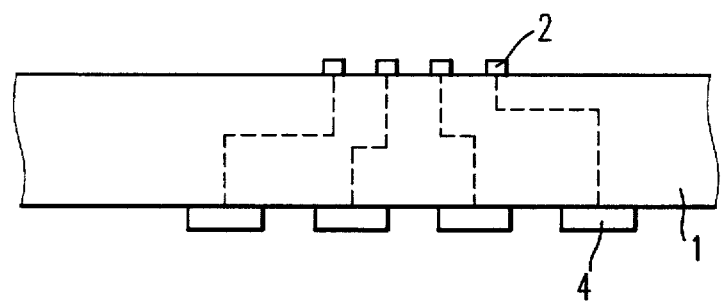
Figure 15C:
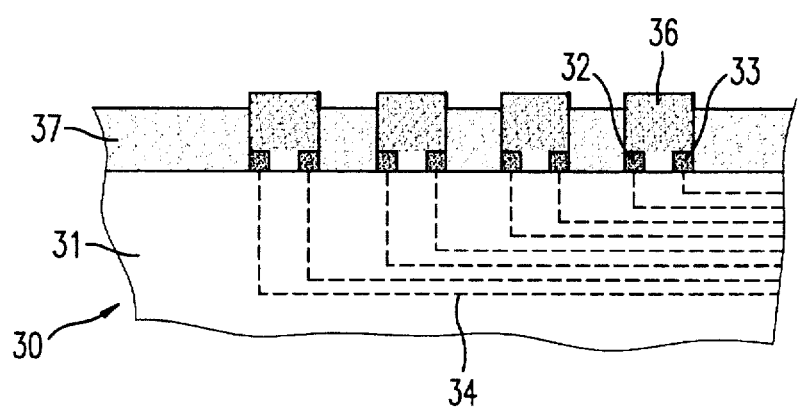
Figure 16:
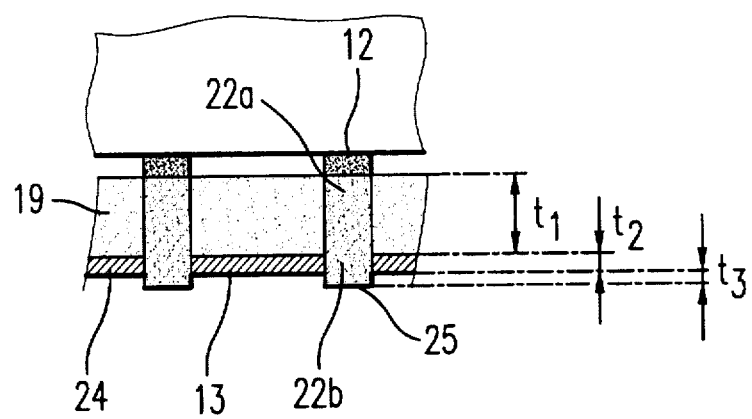
FIG. 16 is a cross-sectional view, on an enlarged scale, illustrating a portion of the connector member shown in FIG. 15.

FIG. 15 is an enlarged view illustrating portions of the upper-side adapter 10, lower-side adapter 30 and circuit board 1 to be inspected shown in FIG. 14, and FIG. 16 is an enlarged view illustrating a portion of a connector member. As illustrated in FIG. 14, on the surface of the inspection circuit board 11, a plurality of connecting electrodes 12 are arranged in a state spaced away from each other according to the arrangement pattern of dot electrodes 2 on one side of the circuit board 1 to be inspected. The connecting electrodes 12 are electrically connected to a tester 50 through their corresponding wiring circuits 14 and a terminal connector 15.

On the upper-side adapter 10, is provided a connector member 13 which is in contact with the surface of the inspection circuit board 11 having the connecting electrodes 12 and electrically connected to the connecting electrodes 12.

The connector member 13 has a sheet-like insulating base 19 composed of an elastic polymeric substance. In the insulating base 19, are arranged a plurality of columnar conductors 25 formed of a conductive elastomer and extending through in the thickness-wise direction of the insulating base according to the pattern of the dot electrodes 2. A front-side terminal 22b is formed by an end on the front side (lower surface in FIG. 15) of each of these conductors 25, while a back-side terminal 22a is formed by an end on the back side (upper surface in FIG. 15).

The front-side terminals 22b are arranged correspondingly to the dot electrodes 2 on the front surface (lower surface in FIG. 15) of the insulating base 19, while the back-side terminals 22a are arranged on the back surface (upper surface in FIG. 15) of the insulating base 19 in contact with their corresponding connecting electrodes 12.

In the case illustrated in FIG. 16, an end surface on the front side of each of the conductors 25, namely, the surface (lower surface in FIG. 16) of the front-side terminal 22b is held in a state projected from the front surface of the insulating base 19, and an end surface on the back side of each of the conductors 25, namely, the surface (upper surface in FIG. 16) of the back-side terminal 22a is located on the same plane as the upper surface of the insulating base 19.

A short-circuit member 24 for electrically connecting the adjacent front-side terminals 22b to each other is provided on the front surface of the insulating base 19.

The short-circuit member 24 is constructed by a conductive plate which has holes having an inner diameter adapted to an outer diameter of the front-side terminal 22b of each of the conductors 25 at positions corresponding to the front-side terminals 22b. The conductors 25 are inserted into respective holes in the short-circuit member 24 in a state that the peripheral surface of each of the conductors 25 are brought into contact with the inner surface of the hole. The front surface of the front-side terminal 22b of the conductor 25 is held in a state projected from the front surface (lower surface in FIG. 15) of the short-circuit member 24.

The insulating base 19 is preferably formed by an elastic polymeric substance. As the elastic polymeric substance forming the insulating base 19, is preferred a polymeric substance having a crosslinked structure, and the same polymeric substance as that used in the layer connector member 16 described above may be used.

The conductive elastomer constituting the conductor 25 may either have anisotropy or have no anisotropy, but is preferably an anisotropically conductive elastomer of the type that the conductivity is exhibited when it is pressed in that such an elastomer is low in electric resistance in the pressurizing direction. For example, a conductive elastomer formed of an elastic polymeric substance having insulating property in which conductive particles are contained may be used.

Specifically, the conductor 25 can be formed, for example, by subjecting a fluid material comprising a polymeric material, which will form an insulating elastic polymeric substance by curing and conductive particles dispersed therein, to a curing treatment. As the polymeric material forming the conductor 25, may be used a polymeric substance of the same kind as the elastic polymeric substance forming the insulating base 19 or the different kind therefrom.

The conductor 25 may be formed either integrally with or separately from the insulating base 19.

As the conductive particles used for forming the conductor 25, may be used particles of the same kind as the conductive particles used for forming the layer connector member 16 described above. The particle diameter of the conductive particles is preferably 3 to 200 μm, particularly 10 to 100 μm in order that deformation under pressure of the conductor 25 in the connector member 13 is made easy, and sufficient electrical contact is achieved among the conductive particles in the conductor 25 in the measurable state.

The term "measurable state" as used herein means a state that the circuit board 1 to be inspected is held under pressure between the upper-side adapter 10 and the lower-side adapter 30, whereby the whole connector member 13 is pressed against the circuit board to be inspected in the thickness-wise direction thereof, and in the case illustrated in FIG. 15, the conductors 25 are pressed in their thickness-wise direction.

Electric resistance between the front-side terminal 22b and the back-side terminal 22a in the measurable state, namely, electric resistance of the pressed conductor 25 in the thickness-wise direction, is preferably 1 Ω or lower so that the electric resistance may be measured with higher precision.

In the short-circuit member 24, electric resistance between adjacent front-side terminals 22b is preferably 1 Ω or lower. For this reason, as the conductive plate forming the short-circuit member 24, there is preferably used a plate having high conductivity, for example, a metal plate formed of copper, silver, nickel, stainless steel, gold or the like, or a resin plate plated with copper, nickel or gold.

In the connector member 13, as illustrated in FIG. 16, the thickness t1 of the insulating base 19 is preferably 50 to 500 μm, particularly 50 to 200 μm, and the thickness t2 of the short-circuit member 24 is preferably 20 to 100 μm, particularly 20 to 50 μm.

The projected height t3 of the conductor 25 projected from the surface of the short-circuit member 24 is preferably 10 to 50 μm. If the projected height t3 of the conductor 25 is smaller than 10 μm, it is difficult to exactly bring the front-side terminal 22b in the conductor 25 into contact with the dot electrode 2 on the circuit board 1 to be inspected when the circuit board 1 to be inspected has distortion such as warpage, so that reliability on electrical connection between the front-side terminal 22b in the conductor 25 and the dot electrode 2 is lowered. If the projected height t3 of the conductor 25 exceeds 50 μm on the other hand, the electric resistance of the conductor 25 at a portion projected becomes high, so that a range of errors of electric resistance measured widened.

The connector member 13 can be produced in accordance with, for example, the following process.

In the electric resistance measuring apparatus for circuit board according to the second aspect, as the lower-side adapter, those having various structures may be used without any particular limitation like those in the electric resistance measuring apparatus according to the first aspect.

Figure 17:
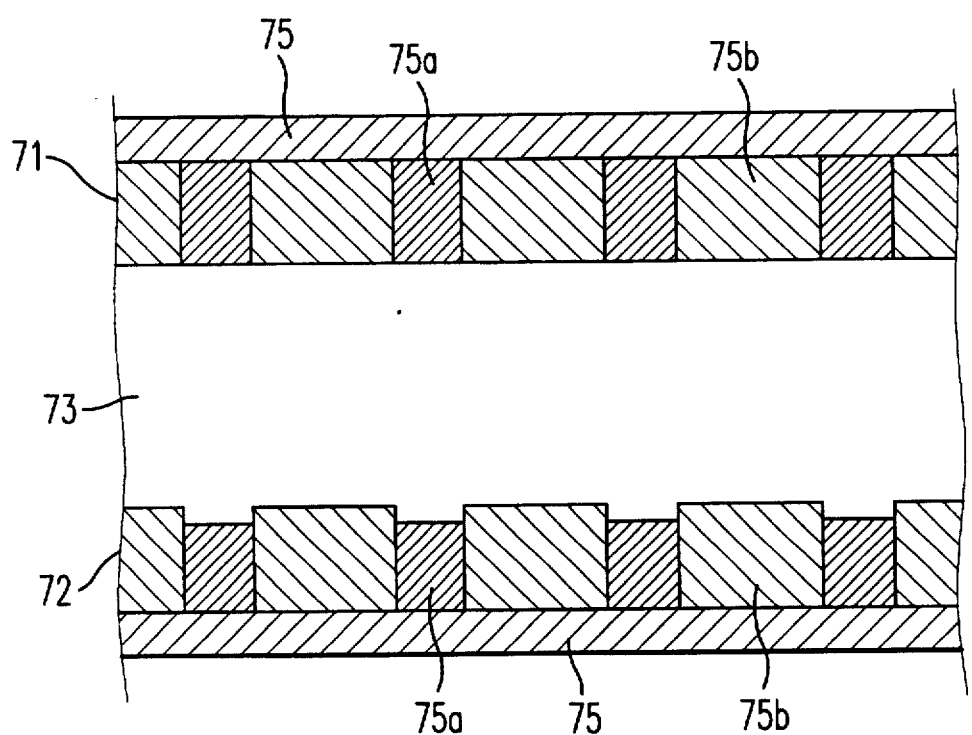
FIG. 17 is a cross-sectional view illustrating the construction of the principal part of an exemplary mold used for producing the connector member.

FIG. 17 is a cross-sectional view illustrating the construction of the principal part of an exemplary mold used for producing the connector member 13.

The mold for producing the connector member is composed of an upper mold 71 and a lower mold 72, which are both in the form of a substantially flat plate as a whole and correspond to each other, and is so constructed that a material layer filled in a molding cavity 73 between the upper mold 71 and the lower mold 72 can be cured under heat while applying a magnetic field to the material layer.

In order to apply a magnetic field to the material layer to form portions having conductivity at proper positions, the upper mold 71 and the lower mold 72 in the mold for producing the connector member are both constructed to have a mosaic-like layer that ferromagnetic portions 75a formed of iron, nickel or the like for causing an intensity distribution in the magnetic field within the mold and non-magnetic portions 75b formed of a non-magnetic metal such as copper, or a resin are alternately arranged on a base plate 75 formed of a ferromagnetic material such as iron or nickel so as to adjoin each other. The ferromagnetic portions 75a are arranged according to a pattern corresponding to the pattern of the conductors 25 to be formed.

Here, the molding surface of the upper mold 71 is flat, while the molding surface of the lower mold 72 has slight irregularities corresponding to the conductors 25 to be formed in the connector member 13.

Such a mold for producing the connector member as described above is used to produce the connector member 13 in the following manner.

Figure 18:
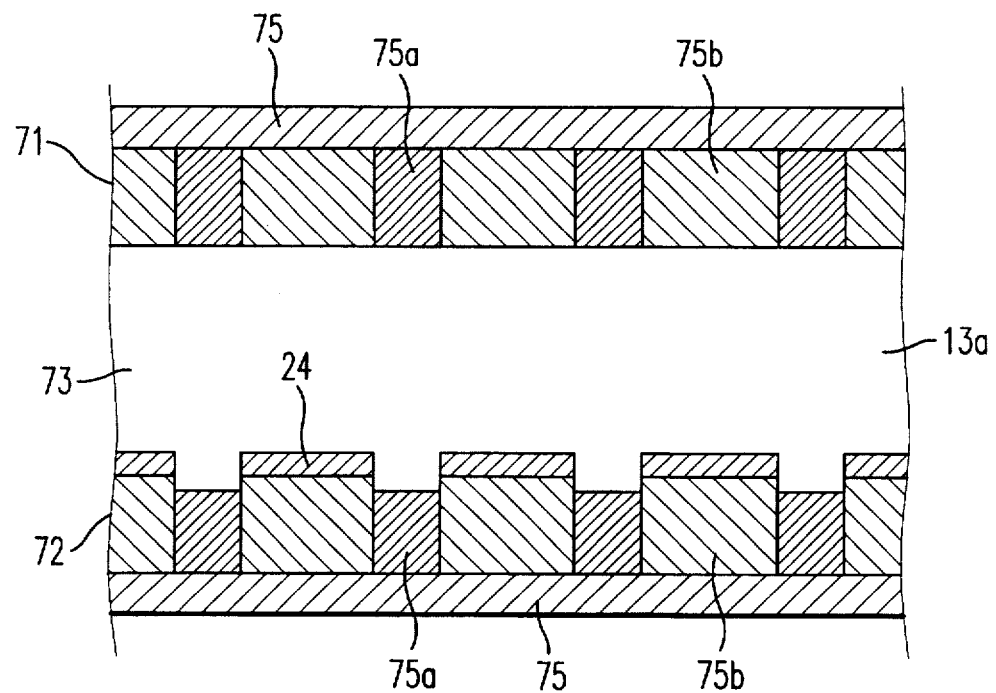
FIG. 18 is a cross-sectional view illustrating a state that a short-circuit member has been arranged on the molding surface of a lower mold in the mold for the production of the connector member, and a molding material layer has been formed in a molding cavity.

As illustrated in FIG. 18, the short-circuit member 24 is first arranged on the molding surface of the lower mold 72 in the molding cavity 73 of the mold for producing the connector member in such a manner that holes thereof are respectively located on the ferromagnetic portions 75a in the lower mold 72. A molding material obtained by containing conductive particles exhibiting magnetic property in a polymeric material, which will form an elastic polymeric substance by curing, is then filled into the molding cavity 73 to form a layer 13A of the molding material.

The ferromagnetic portions 75a and non-magnetic portions 75b in each of the upper mold 71 and the lower mold 72 are then utilized to apply a magnetic field having an intensity distribution in the direction perpendicular to the thickness-wise direction of the molding material layer 13A formed, thereby gathering the conductive particles between the ferromagnetic portions 75a in the upper mold 71 and the ferromagnetic portions 75b in the lower mold 72 located right below the portions 75a by an effect of magnetic force, and further orienting the conductive particles so as to be arranged in the thickness-wise direction.

Figure 19:
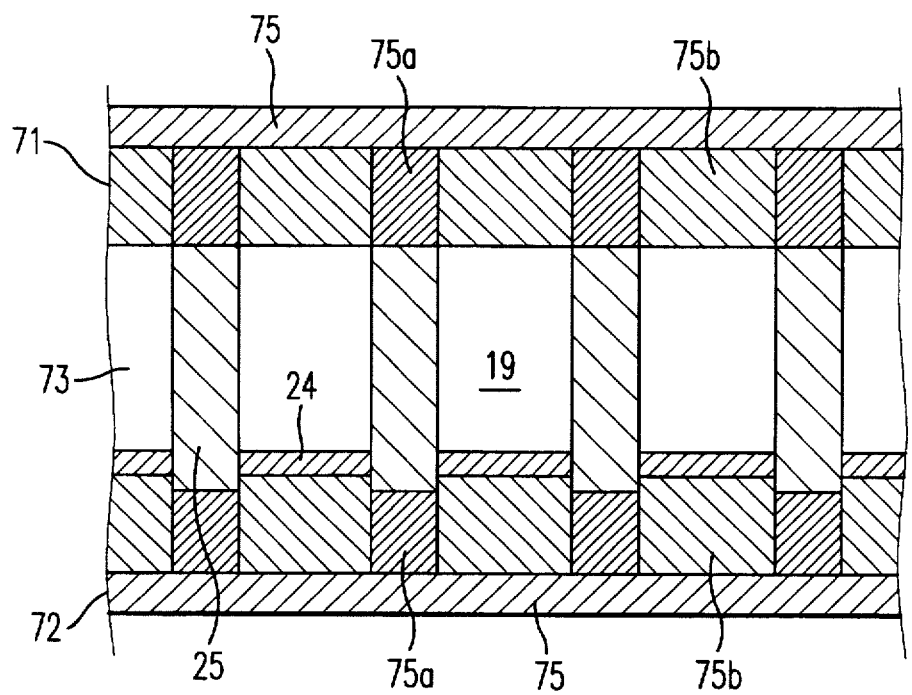
FIG. 19 illustrates a state that the molding material layer has been cured.

In that state, the molding material layer 13A is subjected to a curing treatment, thereby obtaining a molded product in which such an insulating base 19 as illustrated in FIG. 19 is formed integrally with the short-circuit member 24, and conductors 25 extending through the insulating base 19 in its thickness-wise direction and projected from the surface of the short-circuit member 24 are formed. The molded product is released from the mold for producing the connector member, thereby producing the connector member 13.

In the molding material, may be contained a curing catalyst for curing the polymeric material. As such a curing catalyst, an organic peroxide, fatty acid azo compound, catalyst for hydrosililation or the like may be used.

Specific examples of the organic peroxide used as the curing catalyst include benzoyl peroxide, bisdicyclobenzoyl peroxide, dicumyl peroxide, di-tert-butyl peroxide and the like Specific examples of the fatty acid azo compound used as the curing catalyst include azobisisobutyro-nitrile and the like.

Specific examples of those used as catalysts for a hydrosililation reaction include publicly known compounds such as platinic chloride and salts thereof, platinum-unsaturated group-containing siloxane complexes, complexes of vinylsiloxane and platinum, complexes of platinum and 1,3-divinyltetramethyldisiloxane, complexes of triorganophosphine or triorganophosphite and platinum, acetylacetate-platinum chelates, and complexes of a cyclic diene and platinum.

The amount of the curing catalyst used is suitably selected in view of the kinds of the polymeric material and the curing catalyst, and other curing treatment conditions. However, it is generally 3 to 15 parts by weight per 100 parts by weight of the polymeric material.

In the molding material, may be contained the conventional inorganic filler such as silica powder, colloidal silica, aerogel silica or alumina as needed. By containing such an inorganic filler, the thixotropic property of the molding material is ensured, the viscosity thereof becomes high, the dispersion stability of the conductive particles is improved, and moreover the strength of the resulting connector member 13 is enhanced.

No particular limitation is imposed on the amount of such an inorganic filler used. However, the use of the inorganic filler in a great amount is not preferred because the orientation of the conductive magnetic particles by a magnetic field cannot be sufficiently achieved.

The viscosity of the molding material is preferably within a range of 100,000 to 1,000,000 cp at 25° C.

The curing treatment of the molding material layer 13A may be conducted while applying a parallel magnetic field, but may be conducted after the application of the parallel magnetic field is stopped. The intensity of the parallel magnetic field applied to the molding material layer 13A is preferably an intensity that it amounts to 200 to 10,000 G on the average.

As a means for applying the parallel magnetic field, may be used an electromagnet or permanent magnet. As such a permanent magnet, are preferred those composed of alunico (Fe—Al—Ni—Co alloy), ferrite or the like.

In the conductors 25 obtained in such a manner, the conductive particles are oriented so as to be arranged in the thickness-wise direction of the connector member 13, so that good conductivity is achieved even when a proportion of the conductive particle is low.

The conditions of the curing treatment of the molding material layer 13A are suitably selected according to the material used. However, the treatment is generally conducted by a heat treatment. Specific heating temperature and heating time are suitably selected in view of the kind of the polymeric material of the molding material layer 13A, the time required for movement of the conductive magnetic particles, and the like. For example, when the polymeric material is a room temperature curing silicone rubber, the curing treatment is performed for about 24 hours at room temperature, for about 2 hours at 40° C. or for about 30 minutes at 80° C.

In this curing treatment, the conductive particles can be oriented by applying a magnetic field to the resulting molding material layer when the conductive particles are particles of a conductive magnetic material.

In the electric resistance measuring apparatus for circuit boards according to the above-described second aspect, electric resistance between any one of dot electrode 2 and its corresponding grid electrode 4 in the circuit board 1 to be inspected is measured in the following manner. The principle of the measurement is the same as the electric resistance measuring apparatus according to the first aspect.

The circuit board 1 to be inspected is arranged at the predetermined position between the upper-side adapter 10 and the lower-side adapter 30, and in this state, the upper-side adapter 10 is pressed through the elastic cushioning plate 21 by the pressing plate 20 to lower it, and the lower-side adapter 30 is pressed by the pressing plate 40 to lift it, thereby bringing the connector members 13 of the upper-side adapter 10 into contact under pressure with one surface of the circuit board 1 to be inspected to become a state that the front-side terminals 22b are contacted with their corresponding dot electrodes 2, and at the same time, bringing the elastic connecting members 36 of the lower-side adapter 30 into contact under pressure with the other surface of the circuit board 1 to be inspected. This state is the measurable state.

The pressing force for achieving this measurable state is such an intensity that the front-side terminals 22b in the connector members 13 and the elastic connecting members 36 are brought into contact with the circuit board to be inspected under pressure of, for example, 0.1 to 10 kgf/cm$^2$, preferably 0.2 to 2 kgf/cm$^2$.

Specifically described in accordance with the case illustrated in FIG. 15, in this measurable state, the dot electrodes 2 are electrically connected to their corresponding connecting electrodes 12 through the respective conductors 25 related to the front-side terminals 22b contacting with the dot electrodes 2. Since the adjacent front-side terminals 22b are electrically connected to each other by the short-circuit member 24, a dot electrode 2 in a state contacting with a certain front-side terminal 22b is held in a state electrically connected simultaneously to a plurality of connecting electrodes 12 through the connector member 13 on one surface of the circuit board 1 to be inspected.

On the other hand, a pair of measuring electrodes, which consists of the terminal electrode 32 for current supply and the terminal electrode 33 for voltage measurement is electrically connected simultaneously to their corresponding grid electrode 4 through the elastic connecting member 36 on the other surface of the circuit board 1 to be inspected.

When attention is paid to, for example, a dot electrode 2 in this measurable state, connecting electrodes 12 electrically connected to this dot electrode 2 are plural connecting electrodes 12 in the connector member 13, so that the dot electrode 2 cannot be separately treated even when any of the plural connecting electrodes 12 is selected.

Since the grid electrodes 4 on the other surface of the circuit board 1 to be inspected are electrically connected to their corresponding pairs of measuring electrodes each consisting of the terminal electrode 32 for current supply and the terminal electrode 33 for voltage measurement through the elastic connecting member 36, however, any one pair of the measuring electrodes is specified in the tester 50, whereby a specific dot electrode 2 can be specified through its related grid electrode 4.

Since a plurality of the connecting electrodes 12 in the inspection circuit board 11 are electrically connected simultaneously to the specified dot electrode 2 (hereinafter referred to as the "specified electrode"), two of the connecting electrodes 12 are selected in the tester 50 to use one of them as an electrode for current supply and the other as an electrode for voltage measurement, thereby obtaining a voltage signal between the connecting electrode 12 and the terminal electrode 33 for voltage measurement related to the grid electrode 4. This voltage signal permits the measurement of electric resistance between the specified electrode and the grid electrode 4.

Two connecting electrodes 12 selected may be any electrodes among the plural connecting electrodes electrically connected to the specified electrode. However, a connecting electrode 12 corresponding to the specified electrode and a connecting electrode 12 adjacent to this connecting electrode 12 are preferably used in that the electric resistance can be measured with higher precision.

According to the electric resistance measuring apparatus for circuit boards of the construction described above, the adjacent front-side terminals 22b in the connector member 13 are electrically connected to each other by the short-circuit member 24 arranged on the front side of the connector member 13, so that when a front-side terminal 22b comes into contact with a certain dot electrode 2 on one side of the circuit board 1 to be inspected, the dot electrode 2 is electrically connected to a connecting electrode 12 corresponding to the dot electrode 2 through the conductor 25 related to the front-side terminal 22b, and moreover electrically connected simultaneously to a plurality of the connecting electrodes 12 through the short-circuit member 24 and other conductors 25. In the measurable state, one of the plural dot electrodes 2 electrically connected to the plural connecting electrodes 12 is specified as a specified electrode, and two connecting electrodes 12 among the plural connecting electrodes 12 electrically connected to the specified electrode are selected to use one of them as an electrode for current supply and the other as an electrode for voltage measurement, whereby a voltage signal as to the specified electrode can be detected, so that the measurement of electric resistance on the circuit board 1 to be inspected can be performed with high precision.

Since the connecting electrodes 12 and front-side terminals 22b are in corresponding relation of one to one with the dot electrodes 2 of the circuit board 1 to be inspected, these electrodes are allowed to have a large size as substantially equal to the dot electrodes 2. Accordingly, even when the size of the dot electrodes 2 in the circuit board 1 to be inspected is small, the connecting electrodes 12 and front-side terminals 22b can be formed with ease, so that the electric resistance measuring apparatus can be produced with extreme ease.

Since the front-side terminals 22b formed of a conductive elastomer in the connector member 13 are brought into contact under pressure with the dot electrode 2 on one surface of the circuit board 1 to be inspected, a state that the connecting electrodes 12 are electrically connected to the dot electrode 2 can be achieved with certainty without damaging the dot electrode 2.

Since a pair of the terminal electrode 32 for current supply and the terminal electrode 33 for voltage measurement are electrically connected to their corresponding grid electrode 4, through a grid electrode 4 electrically connected to a certain dot electrode 2, one dot electrode 2 related to such a grid electrode 4 can be specified as a specified electrode from among a plurality of dot electrodes.

Since the elastic connecting member 36 formed of an anisotropically conductive elastomer is brought into contact under pressure with the grid electrode 4 on the lower surface of the circuit board 1 to be inspected, a state that the terminal electrode 32 for current supply and the terminal electrode 33 for voltage measurement are, independently of each other, electrically connected to the grid electrode 4 can be achieved with certainty without damaging the grid electrode 4.

Second embodiment

Figure 20A:
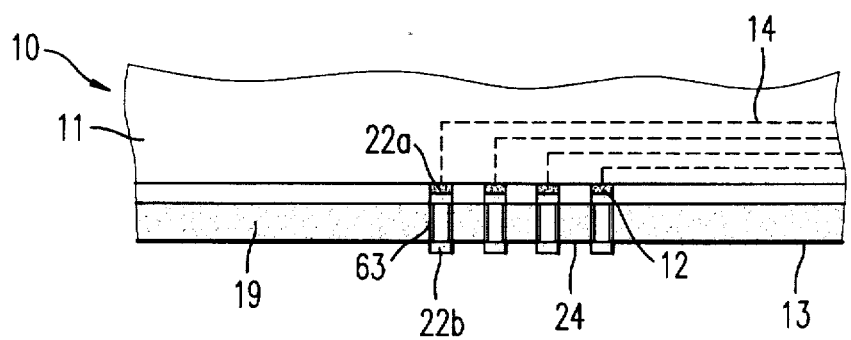
FIG. 20 is a cross-sectional view illustrating the construction of the principal part in an exemplary electric resistance measuring apparatus according to a second embodiment of the second aspect of the present invention.
Figure 20B:
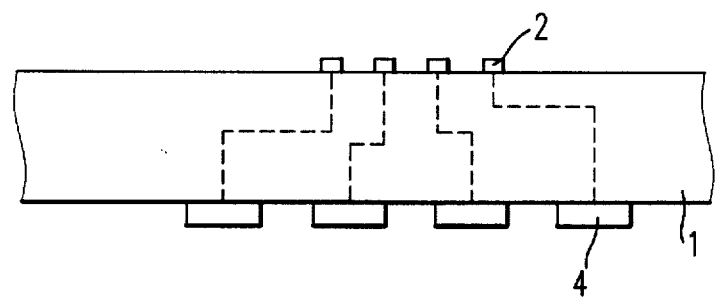
Figure 20C:
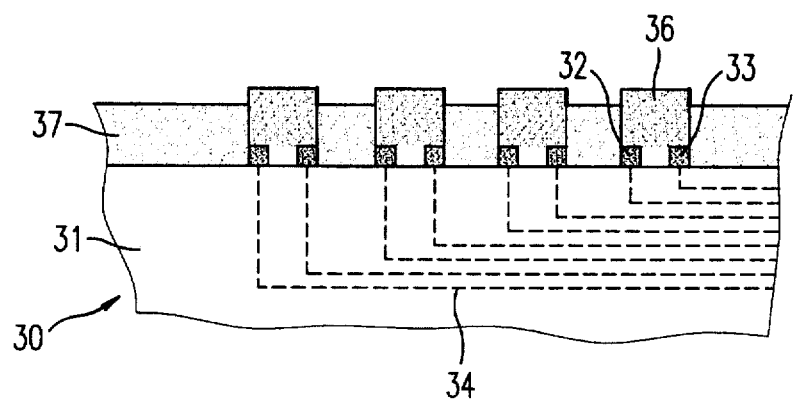
Figure 21:
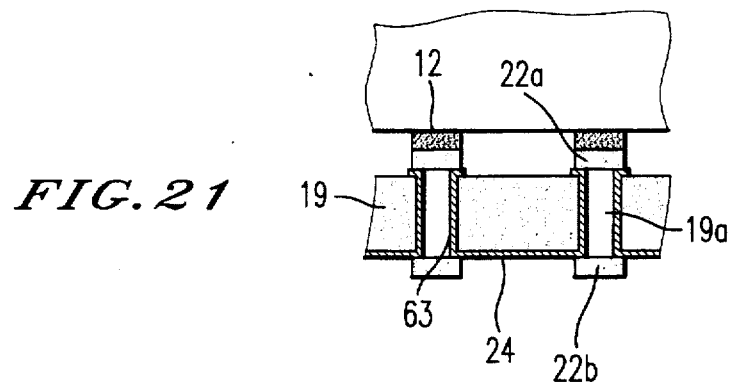
FIG. 21 is a cross-sectional view, on an enlarged scale, illustrating a portion of the connector member shown in FIG. 20.

FIG. 20 is a enlarged view illustrating portions of an upper-side adapter, a lower-side adapter and a circuit board to be inspected in an electric resistance measuring apparatus for circuit boards according to another embodiment of the second aspect of the present invention, and FIG. 21 is an enlarged view illustrating a portion of the connector member shown in FIG. 20

The connector member 13 has a plate-like insulating base 19 composed of a thermosetting resin material. A plurality of front-side terminals 22b composed of a conductive elastomer are provided on the front surface (lower surface in FIG. 20) of the insulating base 19 according to the pattern of dot electrodes 2 so as to project from the surface of the insulating base 19. On the other hand, a plurality of back-side terminals 22a composed of a conductive elastomer are provided on the back surface (upper surface in FIG. 20) of the insulating base 19 so as to locate right above the respective front-side terminals 22b. In the insulating base 19, a through-hole 19A extending in the thickness-wise direction of the insulating base 19 is formed at a position between the front-side terminal 22b and the back-side terminal 22a. A metallic conductor 63 is formed on the inner wall of the through-hole 19A by, for example, a plating treatment. The front-side terminal 22b and the back-side terminal 22a are electrically connected by this metallic conductor 63.

A short-circuit member 24 formed of a metal layer integrally connected to an end on the front side (lower surface in FIG. 21) in the metallic conductor 63 is provided integrally on the front surface of the insulating base 19. The adjacent front-side terminals 22b are electrically connecting to each other by this short-circuit member 24.

The insulating base 19 preferably has a thickness of 50 to 500 μm, particularly 50 to 200 μm.

As examples of the thermosetting resin for forming the insulating base 19, may be mentioned glass fiber reinforced epoxy resins, aramide fiber reinforced epoxy resins, epoxy resins and polyimide resins.

The short-circuit member 24 preferably has a thickness of 0.1 to 100 μm, particularly, 0.2 to 20 μm.

As the metal layer forming the short-circuit member 24, may be used that formed of, for example, copper, nickel, gold or the like.

The electric resistance measuring apparatus for circuit board according to this embodiment has the same structure as the electric resistance measuring apparatus for circuit board illustrated in FIG. 14 except for the construction described above.

The projected height of the front-side terminal 22b is preferably 10 to 50 μm in that high reliability on electrical connection is achieved, and high precision is surely attained in the measurement of electric resistance.

According to the electric resistance measuring apparatus for circuit boards of the construction described above, the adjacent front-side terminals 22b in the connector member 13 are electrically connected to each other by the short-circuit member 24 arranged on the front side of the connector member 13, so that when a front-side terminal 22b comes into contact with a certain dot electrode 2 on one side of the circuit board 1 to be inspected, the clot electrode 2 is electrically connected to a connecting electrode 12 corresponding to the dot electrode 2 through the conductor 25 related to the front-side terminal 22b, and moreover electrically connected simultaneously to a plurality of the connecting electrodes 12 through the short-circuit member 24 and other conductors 25. In the measurable state, one of the plural dot electrodes 2 electrically connected to the plural connecting electrodes 12 is specified as a specified electrode, and two connecting electrodes 12 among the plural connecting electrodes 12 electrically connected to the specified electrode are selected to use one of them as an electrode for current supply and the other as an electrode for voltage measurement, whereby a voltage signal as to the specified electrode can be detected, so that the measurement of electric resistance on the circuit board 1 to be inspected can be performed with high precision.

Since the connecting electrodes 12 and front-side terminals 22b are in corresponding relation of one to one with the dot electrodes 2 of the circuit board 1 to be inspected, these electrodes are allowed to have a large size as substantially equal to the dot electrodes 2. Accordingly, even when the size of the dot electrodes 2 in the circuit board 1 to be inspected is small, the connecting electrodes 12 and front-side terminals 22b can be formed with ease, so that the electric resistance measuring apparatus can be produced with extreme ease.

Since the front-side terminals 22b formed of a conductive elastomer in the connector member 13 are brought into contact under pressure with the dot electrode 2 on one surface of the circuit board 1 to be inspected, a state that the connecting electrodes 12 are electrically connected to the dot electrode 2 can be achieved with certainty without damaging the dot electrode 2.

Since a pair of the terminal electrode 32 for current supply and the terminal electrode 33 for voltage measurement are electrically connected to their corresponding grid electrode 4, through a grid electrode 4 electrically connected to a certain dot electrode 2, one dot electrode 2 related to such a grid electrode 4 can be specified as a specified electrode from among a plurality of dot electrodes.

Since the elastic connecting member 36 formed of an anisotropically conductive elastomer is brought into contact under pressure with the grid electrode 4 on the lower surface of the circuit board 1 to be inspected, a state that the terminal electrode 32 for current supply and the terminal electrode 33 for voltage measurement are, independently of each other, electrically connected to the grid electrode 4 can be achieved with certainty without damaging the grid electrode 4.

Although the embodiments of the electric resistance measuring apparatus according to the second aspect of the present invention have been described above, the following various modifications can be given.

Figure 22A:
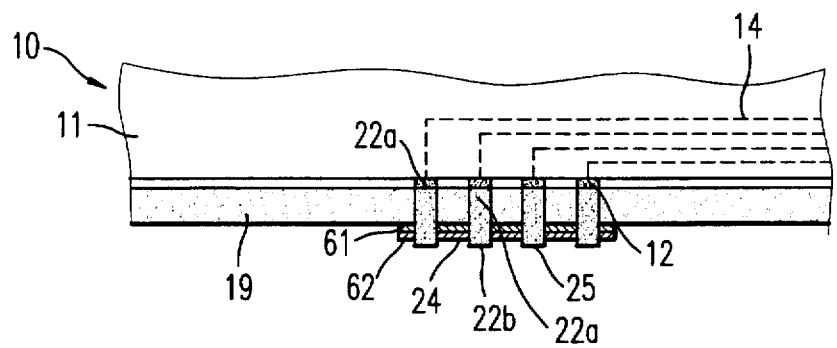
FIG. 22 is a cross-sectional view illustrating a version of the electric resistance measuring apparatus according to the first embodiment of the second aspect of the present invention.
Figure 22B:
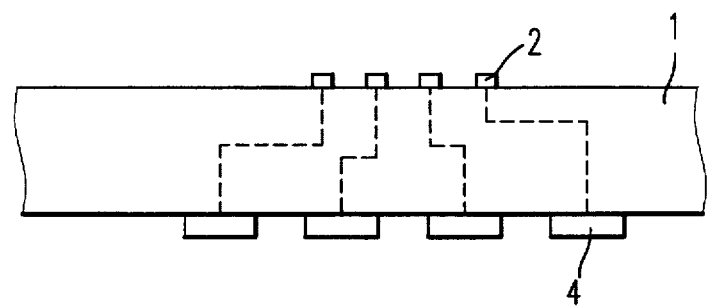
Figure 22C:
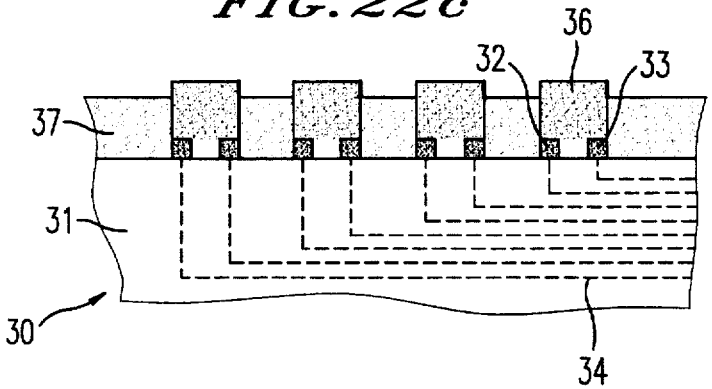
Figure 23:
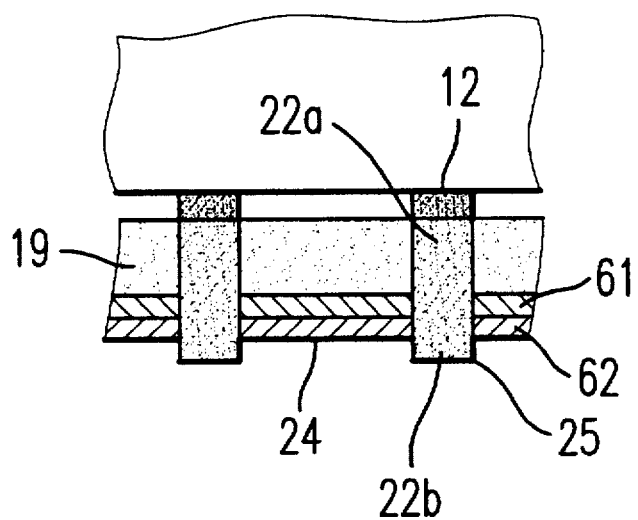
FIG. 23 is a cross-sectional view, on an enlarged scale, illustrating a portion of the connector member shown in FIG. 22.

In the first embodiment, as the short-circuit member 24, there may be used that formed of an insulating plate 61 having a thickness of, for example, 50 to 200 μm composed of, for example, a glass fiber reinforced epoxy resin or the like, and a metal layer 62, which is formed on the surface (lower surface in FIG. 23) thereof, composed of copper or the like and has a thickness of 0.2 to 20 μm, as illustrated in FIGS. 22 and 23, in place of that formed of the conductive plate.

When such a short-circuit member 24 is used, the insulating plate 61 is preferably arranged so at to be contacted to the insulating base 19 in that electric resistance can be measured with high precision.

Figure 24:
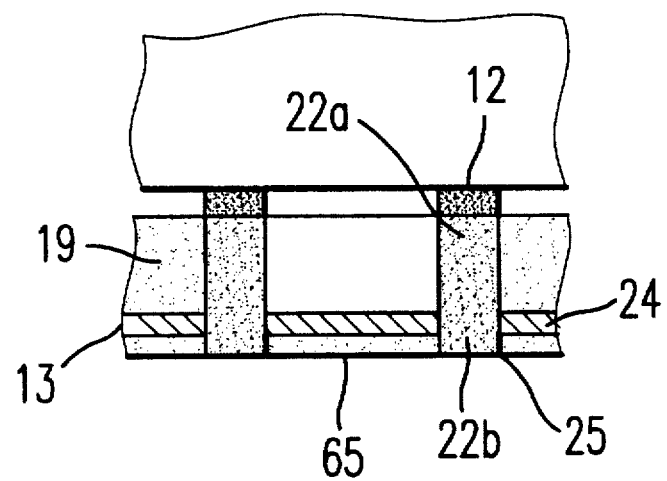
FIG. 24 is a cross-sectional view illustrating another version of the connector member in the electric resistance measuring apparatus according to the second aspect of the present invention.

As illustrated in FIG. 24, the connector member 13 may also be that having an elastic material layer 65 composed of an insulating elastic polymeric substance on the surface (lower surface in FIG. 24) of the short-circuit member 24.

Specifically, the elastic material layer 65 has a thickness equal to the projected height from the short-circuit member 24 in the conductor 25 and is formed integrally on the surface of the short-circuit member 24 so as to surround the conductor 25.

When such a connector member 13 is produced, it is only necessary to use a mold with a lower mold having a flat molding surface (see FIG. 17), form a molding material layer having a required thickness between the lower mold and the short-circuit member 24 and between the upper mold and the short-circuit member 24 in the mold, apply a magnetic field to the molding material layer in this state and subject the molding material layer to a curing treatment. Accordingly, it is unnecessary to use a lower mold having irregularities at the molding surface, so that the production cost of the mold is reduced, and in its turn the production cost of the connector member 13 can be reduced.

Figure 25:
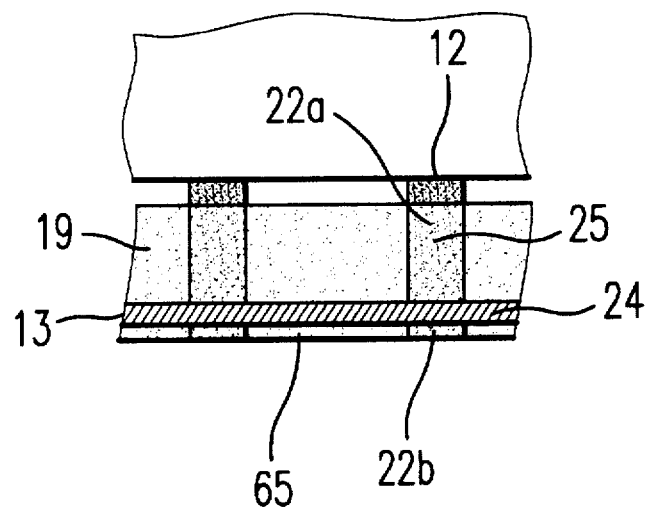
FIG. 25 is a cross-sectional view illustrating further version of the connector member in the electric resistance measuring apparatus according to the second aspect of the present invention.

In the connector member 13, the front-side terminal 22 may be formed separately from the conductor 25 as illustrated in FIG. 25.

Specifically described, in this connector member 13, each conductor 25 is formed in such a manner that the end surface (lower surface in FIG. 25) on the front side thereof is located on the same plane as the lower surface of the insulating base 19, and a short-circuit member 24 formed of a conductive plate is provided so as to cover the end surface on the front side of the conductor 25 and the lower surface of the insulating base 19. On the surface (lower surface in FIG. 25) of the short-circuit member 24, front-side terminals 22b formed of a conductive elastomer are respectively provided at positions right below the conductors 25, and an elastic material layer 65 having a thickness equal to the thickness of the front-side terminals 22b is formed integrally so as to surround the front-side terminals 22b.

In the first embodiment according to the second aspect, the connector member 13 may be formed integrally on the surface of the inspection circuit board 11.

Examples of a process for integrally forming the connector member 13 on the inspection circuit board 11 include a process in which short-circuit member 24 is arranged in a molding cavity 73 of the mold for producing the connector member, the molding material layer 13A is formed thereon, and the inspection circuit board 11 is further arranged thereon, thereby obtaining a molded product, and the like.

In the second embodiment according to the second aspect, that formed of a printed wiring may be used as the short-circuit member 24 in place of that formed of the metal layer.

In the electric resistance measuring apparatus according to the second aspect as well, no particular limitation is imposed on. the construction of the inspection circuit board. of the lower-side adapter so far as a state that a terminal electrode for current supply and a terminal electrode for voltage measurement constituting a pair of measuring electrodes are electrically connected to a grid electrode 4 can be achieved, and various modifications may be used.

Figure 26:
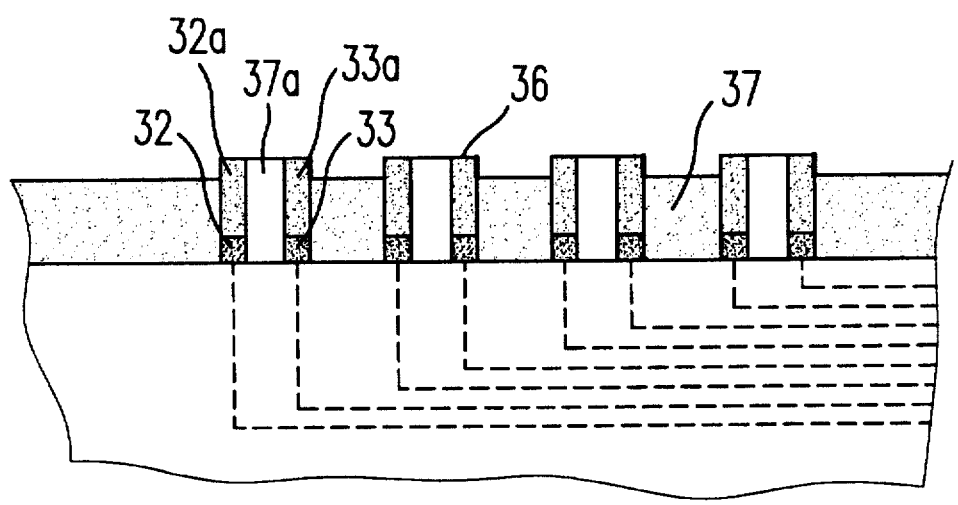
FIG. 26 is a cross-sectional view illustrating another version of the elastic connecting member in the electric resistance measuring apparatus according to the second aspect of the present invention.

For example, as the elastic connecting member 36, there may be used an anisotropically conductive elastomer having conductive portions 32a, 33a, which extend, independently of each other, in the thickness-wise direction at positions corresponding to the terminal electrode 32 for current supply and the terminal electrode 33 for voltage measurement, and an insulating portion 37a for electrically insulating the conductive portions 32a and 33a from each other as illustrated in FIG. 26.

Connecting electrodes on the tips of which a conductive elastomer is provided, and further probe pins, if permitted, may also be used as connecting electrodes.

Figure 27:
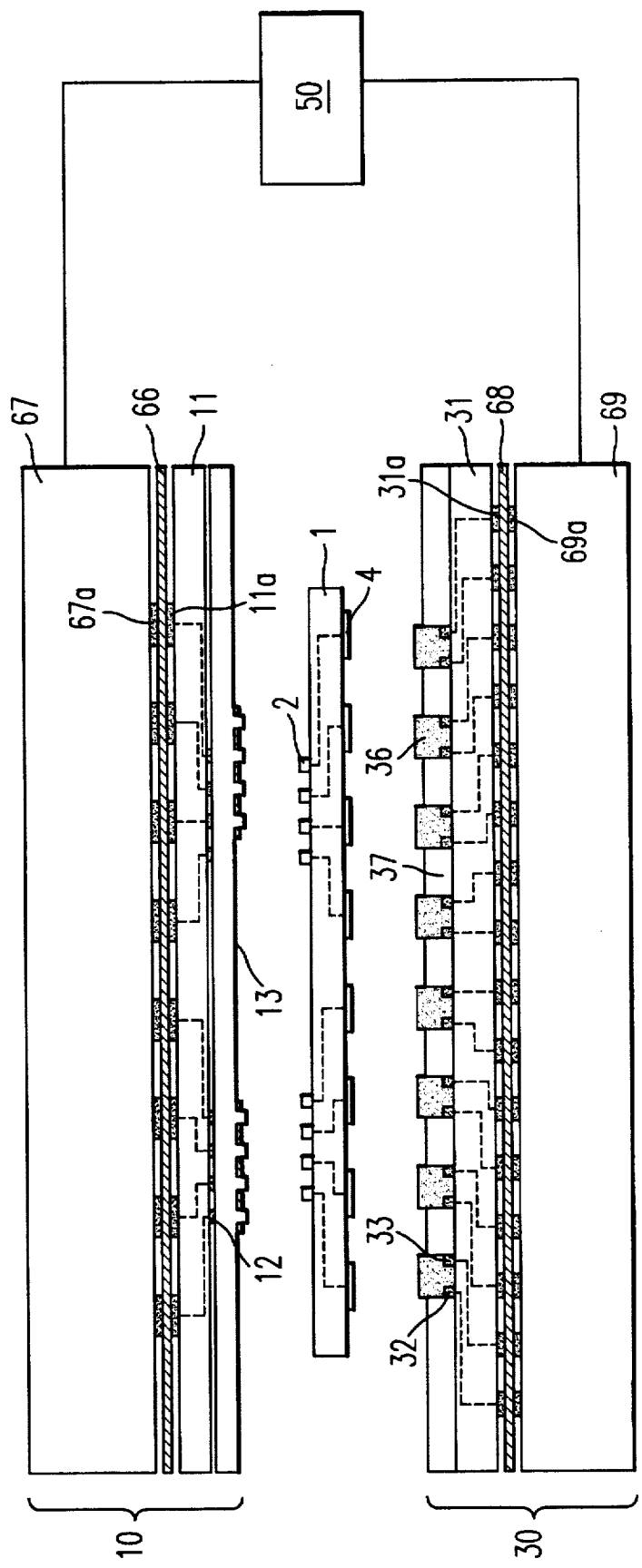
FIG. 27 is a cross-sectional view schematically illustrating the construction of another exemplary electric resistance measuring apparatus according to the second aspect of the present invention together with a circuit board to be inspected.
Figure 28:
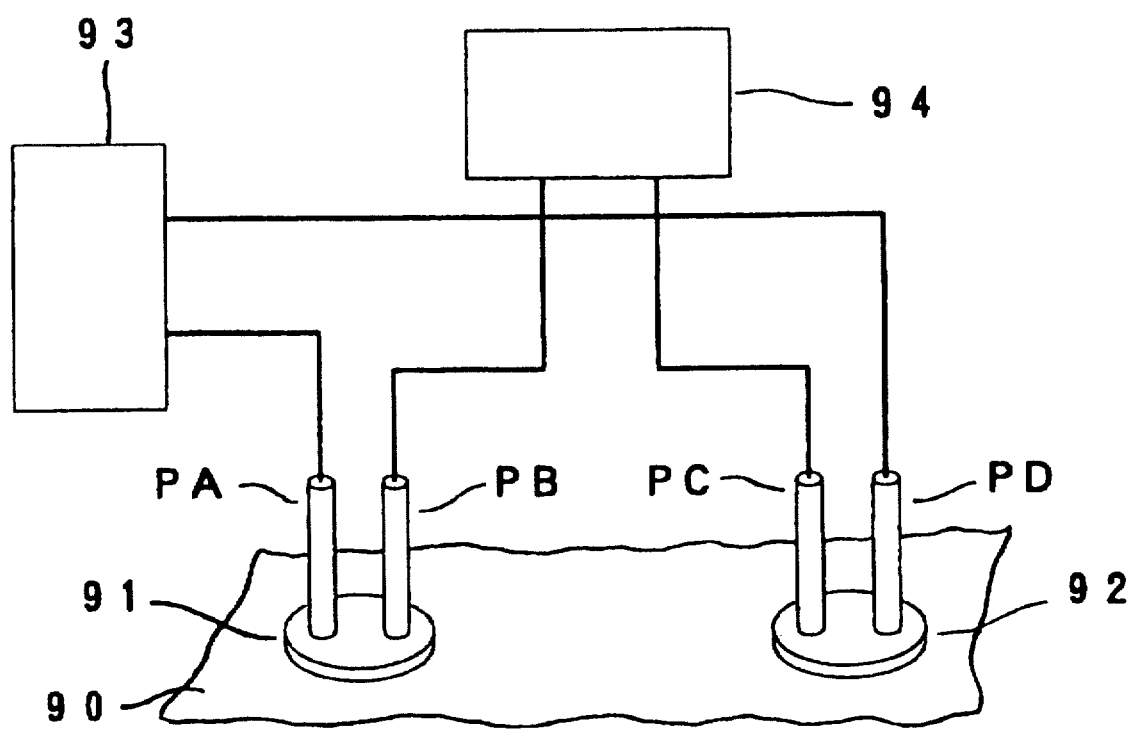
FIG. 28 schematically illustrates an apparatus for measuring electric resistance between electrodes in a circuit board by probes for current supply and probes for voltage measurement

The electric resistance measuring apparatus for circuit boards according to the second aspect of the present invention may also have such a structure as illustrated in FIG. 27.

Specifically described, in this electric resistance measuring apparatus for circuit boards, an upper-side adapter 10 arranged on one side (upper side in FIG. 27) of a circuit board 1 to be inspected and having an inspection circuit board or one-side inspection circuit board 11, and a lower-side adapter 30 arranged on the other side (lower side in FIG. 27) of the circuit board 1 to be inspected and having an inspection circuit board or other-side inspection circuit board 31 are vertically arranged in opposed relation to each other.

On the front surface (lower side in FIG. 27) of the inspection circuit board 11 in the upper-side adapter 10, is provided a connector member 13, while an anisotropically conductive sheet 66 and an electrode plate 67 are arranged in this order on the back surface (upper side in FIG. 27) of the inspection circuit board 11.

On the front surface of the inspection circuit board 11, a plurality of connecting electrodes 12 are arranged in a state spaced away from each other according to the arrangement pattern of dot electrodes 2 on one side of the circuit board 1 to be inspected. On the other hand, terminal electrodes 11a are arranged according to the arrangement pattern of standard arrangement electrodes 67a of the electrode plate 67, which will be described subsequently, on the back surface of the inspection circuit board 11. The terminal electrodes 11a are electrically connected to their corresponding connecting electrodes 12.

The electrode plate 67 has, on the surface thereof (lower side in FIG. 27), the standard arrangement electrode 67a arranged on standard lattice points having a pitch of, for example, 2.54 mm, 1.8 mm or 1.27 mm. The standard arrangement electrodes 67a are respectively electrically connected through inner wiring (not illustrated) of the electrode plate 67 to a tester 50.

In the anisotropically conductive sheet 66, conductive path-forming portions which form conductive paths only in the thickness-wise direction thereof are formed. As such an anisotropically conductive sheet 66, it is preferred that each conductive path-forming portion is formed so as to project in the thickness-wise direction on at least one surface in that high electrical contact stability is exhibited.

On the other hand, on the front surface (upper side in FIG. 27) of the inspection circuit board 31 in the lower-side adapter 30, are arranged elastic connecting members 36 and a holding member 37, while an anisotropically conductive sheet 68 and an electrode plate 69 are arranged in this order on the back surface (lower side in FIG. 27) of the inspection circuit board 31.

On the front surface of the inspection circuit board 31, a terminal electrode 32 for current supply and a terminal electrode 33 for voltage measurement, which constitute a pair of measuring electrodes, are arranged in a state spaced away from each other so as to come into common contact with each of the elastic connecting members 36 arranged according to the arrangement pattern of the grid electrodes 4 on the other surface of the circuit board 1 to be inspected. On the other hand, terminal electrodes 31a are arranged according to the arrangement pattern of standard arrangement electrodes 69a of the electrode plate 69, which will be described subsequently, on the back surface of the inspection circuit board 31. The terminal electrodes 31a are electrically connected to their corresponding terminal electrodes 32 for current supply and terminal electrodes 33 for voltage measurement.

The electrode plate 69 and the anisotropically conductive sheet 68 are the same as the electrode plate 67 and the anisotropically conductive sheet 66 in the upper-side adapter 10, respectively, and the electrode plate 69 has, on the surface thereof (upper side in FIG. 27), the standard arrangement electrode 69a arranged on standard lattice points having a pitch of, for example, 2.54 mm, 1.8 mm or 1.27 mm. The standard arrangement electrodes 69a are respectively electrically connected through inner wiring (not illustrated) of the electrode plate 69 to a tester 50.

In the electric resistance measuring apparatus for circuit boards described above, electric resistance between any one dot electrode 2 in the circuit board 1 to be inspected and its corresponding grid electrode 4 is measured in the same manner as in the electric resistance measuring apparatus for circuit boards illustrated in FIG. 14.

According to such an electric resistance measuring apparatus for circuit boards, inspection cost can be reduced even when electric resistance of circuit boards to be inspected, which are different in the pattern of electrodes to be inspected, is measured, because the anisotropically conductive sheet 66 and the electrode plate 67 in the upper-side adapter 10, and the anisotropically conductive sheet 68 and the electrode plate 69 in the lower-side adapter 30 can be used commonly.

The electric resistance measuring apparatus according to the present invention will hereinafter be described specifically by the following Examples.

In the following Examples, that produced under the following conditions in accordance with the construction of FIGS. 2 and 3 was used as the board to be inspected. Upper surface: (dot electrodes)

Electrode size: 0.13 mm in diameter; arrangement pitch: 0.25 mm; the number of electrodes: 256 Lower surface: (grid electrodes)

Electrode size: 0.3 mm in diameter; arrangement pitch: 0.5 mm; the number of electrodes: 16×16 (256)

EXAMPLE A1

An electric resistance measuring apparatus was produced under the following conditions in accordance with the construction illustrated in FIG. 1.

(1) Upper-side adapter:
[Inspection circuit board]
  Shape and dimensions of connecting electrodes:
    circle, 0.1 mm in diameter
  Clearance between connecting electrodes:
    0.25 mm
[Layer connector member]
  Dimensions: 7 mm×7 mm; thickness: 0.2 mm
  Conductive particles: material: nickel particles plated with gold on their surfaces; average particle diameter: 30 μm; filling rate: 30% by volume
  Elastic polymeric substance: silicone rubber
[Holding member]
  Material: silicone rubber; thickness: 0.2 mm
(2) Lower-side adapter:
[Inspection circuit board]
  Dimensions of electrodes for current supply:
    0.2 mm×0.1 mm
  Dimensions of electrodes for voltage measurement:
    0.2 mm×0.1 mm
  Clearance between an electrode for current supply and an electrodes for voltage measurement:
    70 μm
[Elastic connecting member]
  Dimensions: 300 μm in diameter; thickness: 0.2 mm
  Conductive particles: material: nickel particles plated with gold on their surfaces; average particle diameter: 30 μm; filling rate: 30% by volume
  Elastic polymeric substance: silicone rubber
[Holding member]
  Material: silicone rubber; thickness: 0.2 mm
(3) Tester:
  "OPEN/LEAK Tester R-5600" (resistance measuring range: 10 mΩ to 100 Ω, manufactured by Nidec-Read Corp.)

In the electric resistance measuring apparatus described above, the layer connector members of the upper-side adapter and the elastic connecting members of the lower-side adapter were brought into respective contact with the dot electrodes and grid electrodes of a board to be inspected under a pressure of 3 kgf/cm², a process that two connecting electrodes having the lowest electric resistance to the individual dot electrodes in the measurable state are selected as a pair of measuring electrodes was conducted. on all dot electrodes to be inspected, and one dot electrode was specified so that one connecting electrode of the pair of measuring electrodes as to the specified dot electrode, which had a lower electric resistance value, was used as an electrode for current supply and the other connecting electrode was used as an electrode for voltage measurement, thereby measuring electric resistance between each dot electrode and its corresponding grid electrode. The result is shown in Table 1.

In the above-described measurable state, the electric resistance between the specified dot electrode and the connecting electrode for current supply was 0.2 to 10 Ω, and the electric resistance between the specified dot electrode and the connecting electrode for voltage measurement was 0.5 to 20 Ω.

EXAMPLE A2

An electric resistance measuring apparatus was produced in the same manner as in Example A1 except that an upper-side adapter was produced under the following conditions in accordance with the construction illustrated in FIGS. 11 and 12.
[Inspection circuit board]
  Dimensions of common connecting electrodes:
    0.1 mm×1.5 mm Clearance between common connecting electrodes: 0.22 mm

[Layer connector member]

Dimensions: 7 mm×7 mm; thickness: 0.2 mm

Conductive particles: material: nickel particles plated with gold on their surfaces; average particle diameter: 30 µm; filling rate: 30% by volume Elastic polymeric substance: silicone rubber

[Holding member]

Material: silicone rubber; thickness: 0.2 mm

Electric resistance between each dot electrode and its corresponding grid electrode in the same board to be inspected was measured in the same manner as in Example A1 except that in the electric resistance measuring apparatus described above, two of the common connecting electrodes were used as a pair of measuring electrodes. The result is shown in Table 1.

Control Example A

A Direct Current Voltage-Current Source/Monitor "TR6143" (manufactured by ADVANTEST CORP.) was used to measure electric resistance between each dot electrode and its corresponding grid electrode in the same board to be inspected by probe pins under the same conditions as those in Example A1. The result is shown in Table 1.

Comparative Example A

The same tester as that used in Example A1 was used to measure electric resistance between each dot electrode and its corresponding grid electrode in the same board to be inspected in accordance with the two-terminal resistance measuring method under the same conditions as those in Example A1. The result is shown in Table 1.

TABLE 1

|  | Electric resistance vale (mΩ) |
| --- | --- |
| Example A1 | 200 |
| Example A2 | 190 |
| Control Example A | 100 |
| Comparative Example A | 1500 |

From the results shown in Table 1, it is apparent that according to the two-terminal resistance measuring method related to Comparative Example A, an error as great as 1400 mΩ is produced compared with the measured value (100 mΩ) of electric resistance by the probe pins in Control Example A, while according to the electric resistance measuring apparatus related to Example A1 or Example A2, electric resistance can be measured in a small error range of 100 mΩ or lower compared with the measured value of electric resistance by the probe pins in Control Example A, so that sufficiently high precision from the viewpoint of practical use is achieved.

EXAMPLE B1

An electric resistance measuring apparatus for circuit boards was produced under the following conditions in accordance with the construction illustrated in FIG. 14.

(1) Upper-side adapter:

[Inspection circuit board]

Shape and dimensions of connecting electrodes: circle, 0.1 mm in diameter

Clearance between connecting electrodes: 0.25 mm

[Connector member]

Thickness of insulating base: 200 µm Thickness of short-circuit member: 50 µm Projected height of front-side terminal: 30 µm Outer diameter of conductor: 100 µm Conductive particles: material: nickel particles plated with gold on their surfaces; average particle diameter: 30 µm; filling rate: 30% by volume Elastic polymeric substance: silicone rubber Short-circuit member: a copper plate plated with nickel and gold in this order on its surface; thickness: 50 µm Electric resistance of conductor in the thickness-wise direction in a measurable state: 0.2 Ω

Electric resistance between adjacent front-side terminals: 0.02 Ω

(2) Lower-side adapter:

[Inspection circuit board]

Dimensions of terminal electrodes for current supply: 0.2 mm×0.1 mm

Dimensions of terminal electrodes for voltage measurement: 0.2 mm×0.1 mm

Clearance between a terminal electrode for current supply and a terminal electrodes for voltage measurement: 70 µm

[Elastic connecting member]

Dimensions: 300 µm in diameter; thickness: 0.2 mm

Conductive particles: material: nickel particles plated with gold on their surfaces; average particle diameter: 30 µm; filling rate: 30% by volume Elastic polymeric substance: material: silicone rubber

[Holding member]

Material: silicone rubber; thickness: 0.2 mm (3) Tester:

"OPEN/LEAK Tester R-5600" (resistance measuring range: 10 mΩ to 100 Ω, manufactured by Nidec-Read Corp.)

In the electric resistance measuring apparatus for circuit boards described above, the front-side terminals of the connector members of the upper-side adapter and the elastic connecting members of the lower-side adapter were brought into respective contact with the dot electrodes and grid electrodes of a circuit board to be inspected under a pressure of 2 kgf/cm$^2$, and two of a connecting electrode corresponding to each dot electrode and its adjacent connecting electrode were selected as a pair of measuring electrodes in this state to use one connecting electrode as an electrode for current supply and the other connecting electrode as an electrode for voltage measurement, thereby measuring electric resistance between each dot electrode and its corresponding grid electrode. The result is shown in Table 2.

EXAMPLE B2

An electric resistance measuring apparatus for circuit boards was produced in the same manner as in Example B1 except that a connector member comprising a short-circuit member composed of a glass fiber reinforced epoxy resin sheet having a thickness of 50 µm and a metal layer formed on the surface thereof, which was formed of copper and had a thickness of 8 µm, was used in place of the connector member comprising the short-circuit member composed of a metal plate in accordance with the construction illustrated in FIG. 22, thereby measuring electric resistance between each dot electrode and its corresponding grid electrode in the same circuit board to be inspected. The result is shown in Table 2.

Control Example B

A Direct Current Voltage-Current Source/Monitor "TR6143" (manufactured by ADVANTEST CORP.) was used to measure electric resistance between each dot electrode and its corresponding grid electrode in the same circuit board to be inspected by probe pins under the same conditions as those in Example B1. The result is shown in Table 2.

Comparative Example B

The same tester as that used in Example B1 was used to measure electric resistance between each dot electrode and its corresponding grid electrode in the same circuit board to be inspected in accordance with the two-terminal resistance measuring method under the same conditions as those in Example B1. The result is shown in Table 2.

TABLE 2

|  | Electric resistance vale (mΩ) |
| --- | --- |
| Example B1 | 240 |
| Example B2 | 250 |
| Control Example B | 220 |
| Comparative Example B | 1600 |

From the results shown in Table 2, it is apparent that according to the two-terminal resistance measuring method related to Comparative Example B, an error as great as 1380 mΩ is produced compared with the measured value (220 mΩ) of electric resistance by the probe pins in Control Example B, while according to the electric resistance measuring apparatus related to Example B1 or Example B2, electric resistance can be measured in a small error range of 30 mΩ or lower compared with the measured value of electric resistance by the probe pins in Control Example B, so that sufficiently high precision from the viewpoint of practical use is achieved.

As described above, according to the electric resistance measuring apparatus for circuit boards according to the first aspect of the present invention, electrodes to be inspected can be prevented from being damaged because the layer connector member made of a conductive elastomer is brought into contact with the electrodes to be inspected. In addition, the layer connector member comes into simultaneous contact with all the electrodes of a group consisting of a plurality of electrodes to be inspected, which are adjacent to each other, among the electrodes to be inspected and is hence naturally greater in size than the individual electrodes to be inspected. Accordingly, the layer connector member can be easily formed, so that the electric resistance measuring apparatus can be produced with extreme ease.

According to the electric resistance measuring apparatus for circuit boards according to the second aspect of the present invention, the adjacent front-side terminals in the connector member are electrically connected to each other by the short-circuit member arranged on the surface of the insulating base in the connector member, so that when a front-side terminal corresponding to a certain electrode to be inspected on one side of the circuit board to be inspected comes into contact with said electrode to be inspected, such an electrode to be inspected on said one side is simultaneously electrically connected to the plurality of the connecting electrodes through the connector member. Accordingly, one of the plurality of the electrodes to be inspected on said one side is specified, and 2 connecting electrodes are selected from among the plurality of the connecting electrodes electrically connected to the specified electrodes to be inspected on said one side to use one of them as an electrode for current supply and the other as an electrode for voltage measurement, whereby a voltage signal about the specified electrode to be inspected can be detected, so that the measurement of electric resistance as to the circuit board to be inspected can be performed with high precision.

Since the connecting electrodes and front-side terminals are in corresponding relation of one to one with the electrodes to be inspected on one side of the circuit board to be inspected, these electrodes are allowed to have a large size as substantially equal to the electrodes to be inspected. Accordingly, even when the size of the electrodes to be inspected on one side of the circuit board to be inspected is small, the connecting electrodes and front-side terminals can be formed with ease, so that the electric resistance measuring apparatus can be produced with extreme ease.

When the front-side terminals brought into contact with the electrodes to be inspected on one side of the circuit board to be inspected in the connector member are formed of a conductive elastomer, the electrodes to be inspected are not damaged even when the front-side terminals are brought into respective contact under pressure with the electrodes to be inspected.

According to the electric resistance measuring method for circuit boards according to the present invention, expected measurement of electric resistance on electrodes to be inspected can be performed even in a circuit board, the size of the electrodes of which is small, with high precision.

What is claimed is:

1. An electric resistance measuring apparatus for circuit boards, which comprises a one-side inspection circuit board arranged on one side of a circuit board to be inspected, at which electrodes to be inspected are located, and having a plurality of connecting electrodes at its surface, and layer connector members provided on the surface of the one-side inspection circuit board and formed of a conductive elastomer, wherein:

each of the layer connector members is brought into simultaneous contact with all connecting electrodes belonging to one group consisting of a plurality of connecting electrodes, which are adjacent to each other, among the connecting electrodes at one side thereof to be electrically connected thereto, and at the other side thereof, brought into simultaneous contact with all electrodes to be inspected belonging to one group consisting of a plurality of electrodes to be inspected, which are adjacent to each other, among the electrodes to be inspected on said one side of the circuit board to be inspected to be electrically connected thereto, thereby forming a measurable state, and in this measurable state, one of two electrodes of the connecting electrodes belonging to the group of the connecting electrodes is used as an electrode for current supply, and the other is used as an electrode for voltage measurement, thereby performing measurement of electric resistance related to a specified electrode specified from among the electrodes belonging to the group of the electrodes to be inspected.

2. The electric resistance measuring apparatus for circuit boards according to claim 1, wherein an electric resistance value between the specified electrode to be inspected and the electrode for current supply and an electric resistance value between the specified electrode to be inspected and the electrode for voltage measurement are both 100 kΩ or lower in the measurable state.

3. The electric resistance measuring apparatus for circuit boards according to claim 1, wherein the layer connector members are formed integrally on the front side of the inspection circuit board and are each held, at one surface thereof, in a state brought into simultaneous contact with all the connecting electrodes of the group consisting of a plurality of the connecting electrodes, which are adjacent to each other, among the connecting electrodes on the inspection circuit board to be electrically connected thereto.

4. The electric resistance measuring apparatus for circuit boards according to claim 1, which further comprises an other-side inspection circuit board arranged on the other side opposite to said one side of the circuit board to be inspected, at which the electrodes to be inspected are present, wherein the other-side inspection circuit board has a terminal electrode for current supply and a terminal electrode for voltage measurement which are formed correspondingly to each of grid electrodes formed on the other side of the circuit board to be inspected and are brought into contact under pressure with the grid electrode through a common elastic connecting member.

5. The electric resistance measuring apparatus for circuit boards according to claim 4, wherein a ratio of the electric resistance value in the thickness-wise direction to the electric resistance value in the plane direction in the elastic connecting member is lower than 1.

6. An electric resistance measuring apparatus for circuit boards, which comprises a one-side inspection circuit board arranged on one side of a circuit board to be inspected, and having a plurality of connecting electrodes, which are arranged correspondingly to each of a plurality of electrodes to be inspected on said one side of the circuit board to be inspected, at its surface, and a connector member provided on the surface of the one-side inspection circuit board, wherein:

the connector member is composed of an insulating base in the form of a sheet or plate, a plurality of front-side terminals arranged correspondingly to the electrodes to be inspected on said one side of the circuit board to be inspected on the front surface of the insulating base, back-side terminals arranged on the back surface of the insulating base respectively contacting with the connecting electrodes on the one-side inspection circuit board and electrically connected respectively to the front-side terminals, and a short-circuit member for electrically connecting the adjacent front-side terminals to each other, which is provided on the front surface of the insulating base, the front-side terminals of the connector member are respectively brought into contact with the electrodes to be inspected on said one side of the circuit board to be inspected, thereby electrically connecting each of the electrodes to be inspected to a plurality of the connecting electrodes through the connector member to form a measurable state, and in this measurable state, two electrodes of a plurality of the connecting electrodes electrically connected to a specified electrode to be inspected on said one side of the circuit board to be inspected are selected to use one of them as an electrode for current supply and the other as an electrode for voltage measurement, thereby performing measurement of electric resistance related to the specified electrode.

7. The electric resistance measuring apparatus according to claim 6, wherein the front-side terminals and the back-side terminals are formed of a conductive elastomer.

8. The electric resistance measuring apparatus according to claim 6, wherein the short-circuit member is formed of a conductive plate having holes adapted to the front-side terminals at positions corresponding to the front-side terminals, and the front-side terminals are provided in a state that the surface of each front-side terminal is projected from the surface of the short-circuit member.

9. The electric resistance measuring apparatus according to claim 6, wherein the short-circuit member is formed of an insulating plate having holes adapted to the front-side terminals at positions corresponding to the front-side terminals, and a metal layer formed on the surface thereof, and the front-side terminals are provided in a state that the surface of each front-side terminal is projected from the surface of the short-circuit member.

10. The electric resistance measuring apparatus according to claim 6, wherein the insulating base is formed of an elastic polymeric substance.

11. The electric resistance measuring apparatus according to claim 6, wherein the front-side terminals and the back-side terminals are electrically connected to each other by a metallic conductor extending through in the thickness-wise direction of the insulating base.

12. The electric resistance measuring apparatus according to claim 6, wherein an electric resistance value between the adjacent front-side terminals electrically connected by the short-circuit member is 1 Ω or lower.

13. The electric resistance measuring apparatus according to claim 6, wherein the connector member has a conductor made of a conductive elastomer, said conductor extending through in the thickness-wise direction of the insulating base and being formed so as to project from the surface of the insulating base, the front-side terminals are formed by an end on the front side of the conductor, and the back-side terminals are formed by an end on the back side of the conductor.

14. The electric resistance measuring apparatus according to claim 6, which further comprises an other-side inspection circuit board arranged on the other side of the circuit board to be inspected, wherein the other-side inspection circuit board has, on the surface thereof, a terminal electrode for current supply and a terminal electrode for voltage measurement which are arranged with a space from each other correspondingly to each of electrodes to be inspected on the other side of the circuit board to be inspected and are electrically connected to the same electrode to be inspected on the other side.

15. An electric resistance measuring method for circuit boards, which include a one-side inspection circuit board arranged on one side of a circuit board to be inspected, at which electrodes to be inspected are located, and having a plurality of connecting electrodes at its surface, and layer connector members provided on the surface of the one-side inspection circuit board and formed of a conductive elastomer, comprising steps of;

bringing each of the layer connector members into simultaneous contact with all connecting electrodes belonging to one group of a plurality of connecting electrodes, which are adjacent to each other, among the connecting electrodes at one side thereof to be electrically connected thereto, and at the other side thereof, brought into simultaneous contact with all electrodes to be inspected belonging to one group of a plurality of electrodes to be inspected, which are adjacent to each other, among the electrodes to be inspected on said one side of the circuit board to be inspected to be electrically connected thereto, thereby forming a measurable state, and using, in this measurable state, one of two electrodes of the connecting electrodes belonging to the group of the connecting electrodes as an electrode for current supply, and using the other as an electrode for voltage measurement, thereby performing measurement of electric resistance related to a specified electrode specified from among the electrodes belonging to the group of the electrodes to be inspected.

16. The electric resistance measuring method for circuit boards according to claim 15, wherein an electric resistance value between the specified electrode to be inspected and the electrode for current supply and an electric resistance value between the specified electrode to be inspected and the electrode for voltage measurement are both 100 kΩ or lower in the measurable state.

17. The electric resistance measuring method for circuit boards according to claim 15, wherein the layer connector members are formed integrally on the front side of the inspection circuit board and are each held, at one surface thereof, in a state brought into simultaneous contact with all the connecting electrodes of the group consisting of a plurality of the connecting electrodes, which are adjacent to each other, among the connecting electrodes on the inspection circuit board to be electrically connected thereto.

18. The electric resistance measuring method for circuit boards according to claim 15, which further includes an other-side inspection circuit board arranged on the other side opposite to said one side of the circuit board to be inspected, at which the electrodes to be inspected are present, wherein
the other-side inspection circuit board has a terminal electrode for current supply and a terminal electrode for voltage measurement which are formed correspondingly to each of grid electrodes formed on the other side of the circuit board to be inspected and are brought into contact under pressure with the grid electrode through a common elastic connecting member.

19. The electric resistance measuring method for circuit boards according to claim 18, wherein a ratio of the electric resistance value in the thickness-wise direction to the electric resistance value in the plane direction in the elastic connecting member is lower than 1.

20. The electric resistance measuring method for circuit board according to claim 15, wherein two connecting electrodes having the lowest electric resistance to the specified electrode to be inspected in the measurable state are selected to use one of them as an electrode for current supply and the other as an electrode for voltage measurement.

21. The electric resistance measuring method for circuit board according to claim 15, wherein two connecting electrodes used as the electrode for current supply and the electrode for voltage measurement have an electric resistance value of at least 10 mΩ between them through the layer connector member held in the measurable state.

22. An electric resistance measuring method for circuit boards, which include a one-side inspection circuit board arranged on one side of a circuit board to be inspected, and having a plurality of connecting electrodes, which are arranged correspondingly to each of a plurality of electrodes to be inspected on said one side of the circuit board to be inspected, at its surface, and a connector member provided on the surface of the one-side inspection circuit board, wherein:
the connector member is composed of an insulating base in the form of a sheet or plate, a plurality of front-side terminals arranged correspondingly to the electrodes to be inspected on said one side of the circuit board to be inspected on the front surface of the insulating base, back-side terminals arranged on the back surface of the insulating base respectively contacting with the connecting electrodes on the one-side inspection circuit board and electrically connected respectively to the front-side terminals, and a short-circuit member for electrically connecting the adjacent front-side terminals to each other, which is provided on the front surface of the insulating base, the method comprising steps of;
bringing the front-side terminals of the connector member respectively into contact with the electrodes to be inspected on said one side of the circuit board to be inspected, thereby electrically connecting each of the electrodes to be inspected to a plurality of the connecting electrodes through the connector member to form a measurable state, and
selecting to use, in this measurable state, two electrodes of a plurality of the connecting electrodes electrically connected to a specified electrode to be inspected, on said one side of the circuit board to be inspected, one of them as an electrode for current supply and the other as an electrode for voltage measurement, thereby performing measurement of electric resistance related to the specified electrode.

23. The electric resistance measuring method according to claim 22, wherein the front-side terminals and the back-side terminals are formed of a conductive elastomer.

24. The electric resistance measuring method according to claim 22, wherein the short-circuit member is formed of a conductive plate having holes adapted to the front-side terminals at positions corresponding to the front-side terminals, and the front-side terminals are provided in a state that the surface of each front-side terminal is projected from the surface of the short-circuit member.

25. The electric resistance measuring method according to claim 22, wherein the short-circuit member is formed of an insulating plate having holes adapted to the front-side terminals at positions corresponding to the front-side terminals, and a metal layer formed on the surface thereof, and the front-side terminals are provided in a state that the surface of each front-side terminal is projected from the surface of the short-circuit member.

26. The electric resistance measuring method according to claim 22, wherein the insulating base is formed of an elastic polymeric substance.

27. The electric resistance measuring method according to claim 22, wherein the front-side terminals and the back-side terminals are electrically connected to each other by a metallic conductor extending through in the thickness-wise direction of the insulating base.

28. The electric resistance measuring method according to claim 22, wherein an electric resistance value between the adjacent front-side terminals electrically connected by the short-circuit member is 1 Ω or lower.

29. The electric resistance measuring method according to claim 22, wherein the connector member has a conductor made of a conductive elastomer, said conductor extending through in the thickness-wise direction of the insulating base and being formed so as to project from the surface of the insulating base, the front-side terminals are formed by an end on the front side of the conductor, and the back-side terminals are formed by an end on the back side of the conductor.

30. The electric resistance measuring method according to claim 22, which further includes an other-side inspection circuit board arranged on the other side of the circuit board to be inspected, wherein
the other-side inspection circuit board, has on the surface thereof, a terminal electrode for current supply and a terminal electrode for voltage measurement which are arranged with a space from each other correspondingly to each of electrodes to be inspected on the other side of the circuit board to be inspected and are electrically connected to the same electrode to be inspected on the other side.

* * * * *